United States Patent
Ogihara et al.

(10) Patent No.: US 6,790,695 B2
(45) Date of Patent: Sep. 14, 2004

(54) SEMICONDUCTOR DEVICE AND METHOD OF MANUFACTURING THE SAME

(75) Inventors: Mitsuhiko Ogihara, Tokyo (JP); Hiroyuki Fujiwara, Tokyo (JP)

(73) Assignee: Oki Data Corporation, Gunma (JP)

( * ) Notice: Subject to any disclaimer, the term of this patent is extended or adjusted under 35 U.S.C. 154(b) by 0 days.

(21) Appl. No.: 10/716,601

(22) Filed: Nov. 20, 2003

(65) Prior Publication Data

US 2004/0110316 A1 Jun. 10, 2004

(30) Foreign Application Priority Data

Nov. 20, 2002 (JP) ........................................ 2002-336236

(51) Int. Cl.$^7$ ........................ H01L 21/00; H01L 21/301
(52) U.S. Cl. ......................................... 438/33; 438/462
(58) Field of Search ..................... 438/21–47, 455–464, 438/106–107, 977

(56) References Cited

U.S. PATENT DOCUMENTS

| | | | | |
|---|---|---|---|---|
| 5,665,607 A | * | 9/1997 | Kawama et al. | 438/64 |
| 5,827,751 A | * | 10/1998 | Nuyen | 438/28 |
| 5,858,814 A | * | 1/1999 | Goossen et al. | 438/107 |
| 5,919,713 A | * | 7/1999 | Ishii et al. | 438/464 |
| 6,025,251 A | * | 2/2000 | Jakowetz et al. | 438/464 |
| 6,071,795 A | * | 6/2000 | Cheung et al. | 438/458 |
| 6,204,079 B1 | * | 3/2001 | Aspar et al. | 438/25 |
| 6,303,462 B1 | * | 10/2001 | Gidon | 438/406 |
| 6,365,429 B1 | * | 4/2002 | Kneissl et al. | 438/46 |
| 6,423,560 B1 | * | 7/2002 | Trezza et al. | 438/25 |
| 6,485,993 B2 | * | 11/2002 | Trezza et al. | 438/22 |
| 6,518,079 B2 | * | 2/2003 | Imler | 438/33 |
| 6,555,405 B2 | * | 4/2003 | Chen et al. | 438/22 |
| 6,562,127 B1 | * | 5/2003 | Kud et al. | 117/94 |
| 6,613,610 B2 | * | 9/2003 | Iwafuchi et al. | 438/128 |
| 2002/0123210 A1 | * | 9/2002 | Liu | 438/459 |
| 2003/0170965 A1 | * | 9/2003 | Kondo | 438/455 |
| 2003/0207493 A1 | * | 11/2003 | Trezza et al. | 438/107 |
| 2004/0009649 A1 | * | 1/2004 | Kub et al. | 438/459 |

FOREIGN PATENT DOCUMENTS

JP          10-63807          3/1998

* cited by examiner

*Primary Examiner*—Savitri Mulpuri
(74) *Attorney, Agent, or Firm*—Takeuchi & Takeuchi

(57) ABSTRACT

A method of manufacturing a semiconductor device capable of reducing the manufacturing cost and preventing the yield-down caused by etching process comprises the steps of forming a separation layer 120 and an epitaxial film 130 carrying LEDs 130c on a substrate 110, forming a protection layer 150 on the epitaxial film, forming etching grooves by etching a region of the epitaxial film, which is not covered by the protection layer, etching the separation layer to make discrete epitaxial films 130a, and adhering the discrete epitaxial films 130a onto the surface of a silicon substrate 170.

19 Claims, 22 Drawing Sheets

SEMICONDUCTOR DEVICE AND METHOD OF MANUFACTURING THE SAME

BACKGROUND OF THE INVENTION

1. Field of the Invention

This invention relates to a semiconductor device, such as an LED print head for an electro-photographic printer, and a method of manufacturing the same.

2. Description of the Related Art

FIG. 26 is a perspective view of part of an LED print head 900 according to a related art and FIG. 27 is a top plan view of part of an LED array chip 902 for the LED print head in FIG. 26. In FIG. 26, the LED print head 900 comprises a substrate 901, the LED array chip 902 formed on the substrate 901, and a driving IC chip 904 formed on the substrate 901. Electrode pads 903 of the LED array chip 902 and electrode pads 905 of the driving IC chip 904 are connected by bonding wires 906, and the electrode pads 909 of the driving IC chip 904 and electrode pads 910 of the substrate 901 are connected by bonding wires 911.

In Japanese Patent Application Kokai Number 10-063807 (hereinafter "patent document"), a light emitting device having thin film structure is disclosed. In the patent document, it is described that a plurality of thin films forming the light emitting device are developed and then elements are separated by etchant.

However, in the LED print head 900, as shown in FIG. 27, large electrode pads 903 and 905 (for example, 100 $\mu$m×100 $\mu$m) are provided on the LED array chip 902 and the driving IC chip 904, respectively, for electrically connecting the LED array chip 902 and the driving IC chip 904 by the bonding wires 906. Accordingly, it was difficult to make the size of the LED array chip 902 small, which made it difficult to reduce the material cost. In the LED array chip 902, a light emitting section 907 is located in a region of approximately 5 $\mu$m deep from the surface. However, in the LED print head in FIG. 26, it has been required that the thickness of the LED array chip 902 is made substantially equal to that of the driving IC chip 904 (for example, 250 $\mu$m to 300 $\mu$m) to secure a stable wire bonding yield. Accordingly, it was difficult to reduce the material cost of the LED array chip 902 for the LED print head 900.

In the patent reference, it is disclosed that the light emitting device having the thin film structure is provided with an electrode pad for a soldering ball for connecting the electrode pad to a discrete pad. Accordingly, it was difficult to reduce the size of the light emitting device.

Also, as described above, in the patent reference, it is disclosed that the elements are separated by etchant. However, a critical technical problem is not disclosed in the patent reference that some materials for the respective semiconductor thin films and/or some etchants may cause etching of not only parts required for the separation or removal of the semiconductor thin films but also other parts, such as inter-layer insulating thin films and wiring materials.

BRIEF SUMMARY OF THE INVENTION

Accordingly, it is an object of this invention to provide a semiconductor device, wherein the miniaturization of the device and cost reduction of the material can be achieved, and a method of manufacturing a semiconductor device, wherein yield reduction caused by the etching problem is prevented besides the achievement of the miniaturization of the device and cost reduction of the materials.

According to the invention, a method of manufacturing a semiconductor device comprises the steps of forming a separation layer on a second substrate, forming the semiconductor thin film including all or part of semiconductor elements on the separation layer, forming a protection layer on the semiconductor thin film such that the protection layer covers part of the semiconductor thin film, forming a plurality of etching grooves by etching a region of the semiconductor thin film, which is not covered by the protection layer, so that the etching grooves divide the semiconductor thin film into a plurality of semiconductor thin sub-films, the etching groove reaching the separation layer, etching the separation layer to make a plurality of discrete semiconductor thin films from the semiconductor thin sub-films, adhering the discrete semiconductor thin films onto the surface of the first substrate, and removing the protection layer. The protection layer is made of a material which has etching resistance against etchants used in the steps of forming the etching grooves and etching the separation layer. Here, the etching resistance property means that the function of the protection layer of protecting the semiconductor thin film is not damaged by the followings reasons:

1. The material of the protection layer is not dissolved, decomposed, or broken by the etchant for the steps of forming the etching grooves and etching the separation layer.
2. The adhesion of the interface between the protection layer and the surface of the semiconductor thin film is not damaged by the penetration of the etchant through the interface.
3. The adhesion of the interface between the protection layer and the surface of the semiconductor thin film is not damaged by the penetration of the etchant through the protection layer up to the interface.

DESCRIPTION OF THE PREFERRED EMBODIMENT (First Embodiment)

Figure 1:
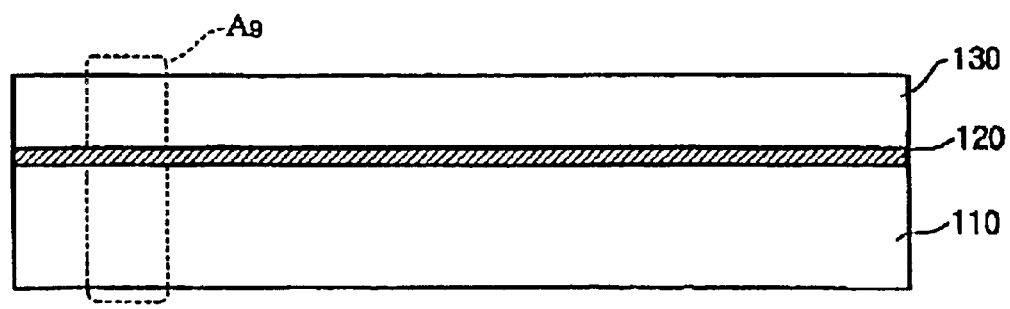
FIG. 1 is a sectional view of an LED/driving IC composite chip according to the first embodiment of the present invention, showing the first part of process of manufacturing the composite chip.

In FIG. 1, a separation layer 120 is formed on a semiconductor substrate 110 and an epitaxial film 130 is formed on the separation layer 120 as a semiconductor thin film. The epitaxial film 130 or a semiconductor epitaxial layer is to be or has been separated or peeled off from the substrate 110 to become the semiconductor thin film, and functions as a semiconductor element. The epitaxial film 130 can be formed by metal organic chemical vapor deposition (CVD) method or molecular beam epitaxial (MBE) method.

Figure 9:
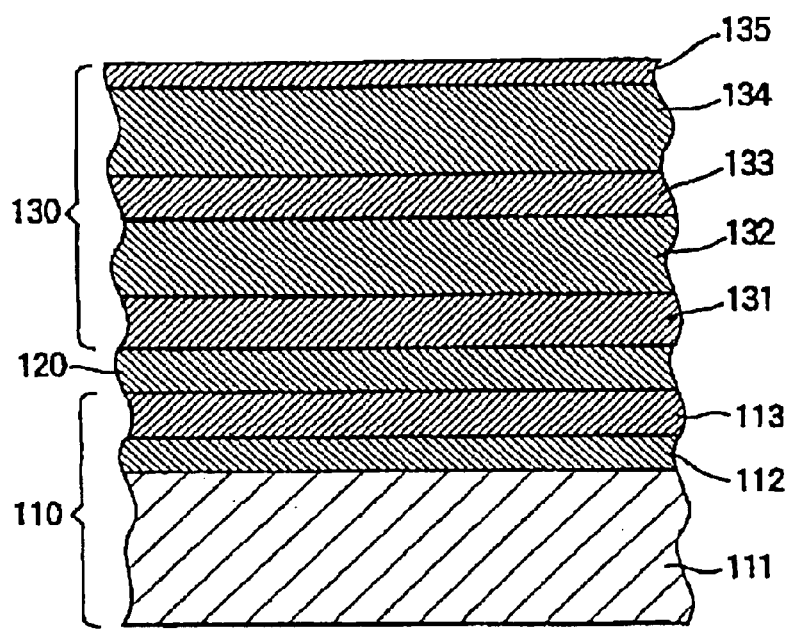
FIG. 9 is an enlarged view of a section A9 of FIG. 1.

The manufacturing process of the epitaxial film 130 is described in detail with reference to FIG. 9. In FIG. 9, the substrate 110 comprises, for example, a GaAs substrate 111, a GaAs buffer layer 112, and an (AlGa)InP etching stopping layer 113 formed in this order. The separation layer 120 is made of, for example, AlAs. The epitaxial film 130 comprises, for example, a GaAs first contact layer 131 (for example, n-type GaAs layer 131), an AlGaAs lower clad layer 132 (n-type $Al_xGa_{1-x}As$ layer 132), an AlGaAs active layer 133 (n-type $Al_yGa_{1-y}As$ layer 133), an AlGaAs upper clad layer 134 (n-type $Al_zGa_{1-z}As$ layer 134), and GaAs second contact layer 135 (n-type GaAs layer 135) formed on the separation layer 120 in this order. Here, x, y, and z meet the expressions; $0<x\leq1$, $0\leq y<1$, and $0<z\leq1$. The n-type GaAs layer 131 has a thickness of approximately 10 nm (0.1 μm), the n-type $Al_xGa_{1-x}As$ layer 132 approximately 0.5 μm, the n-type $Al_yGa_{1-y}As$ layer 133 approximately 1 μm, the n-type $Al_zGa_{1-z}As$ layer 134 approximately 0.5 μm, and the n-type GaAs layer 135 approximately 10 nm (0.1 μm). Accordingly, the thickness of the epitaxial film 130 is approximately 2.02 μm. However, The thicknesses of the respective layers are not limited to the above values.

Other materials, such as $(Al_xGa_{1-x})_yIn_{1-y}P$ (0<x<1 and 0<y<1), GaN, AlGaN, and InGaN, may be used as the semiconductor epitaxial layer. Also, the substrate 110 may not have the $(Al_xGa_{1-x})_yIn_{1-y}P$ layer 113.

Figure 2:
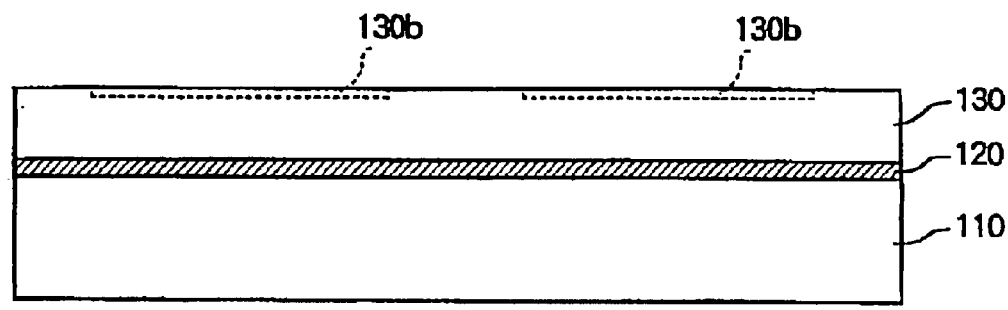
FIG. 2 is a sectional view of the LED/driving IC complex chip of FIG. 1, showing the second part of process of manufacturing the composite chip.

In FIG. 2, an LED (a light emitting region 130c in FIG. 12) is formed in a semiconductor element formation region 130b.

Figure 3:
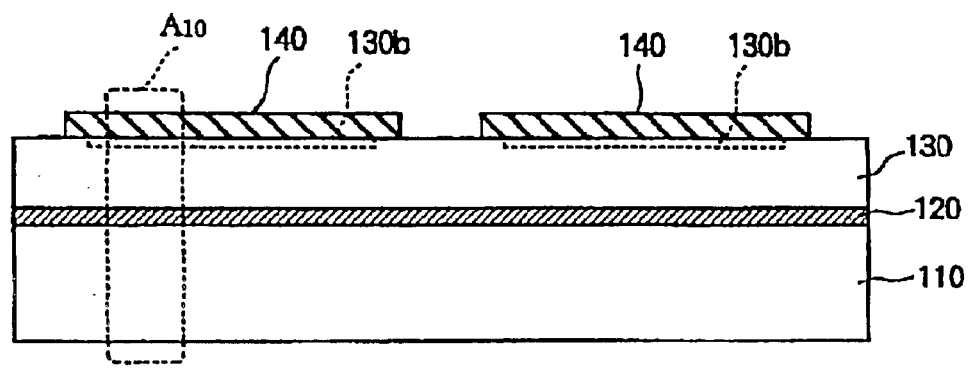
FIG. 3 is a sectional view of the LED/driving IC complex chip of FIG. 1, showing the third part of process of manufacturing the composite chip.

In FIG. 3, a dielectric film 140 is formed in predetermined regions on the epitaxial film 130. The dielectric film 140 may be made of any of, for example, $SiO_2$, $Si_3O_4$, SiN, aluminum oxide, and aluminum nitride. The dielectric layer 140 has an opening above the LED.

Figure 10:
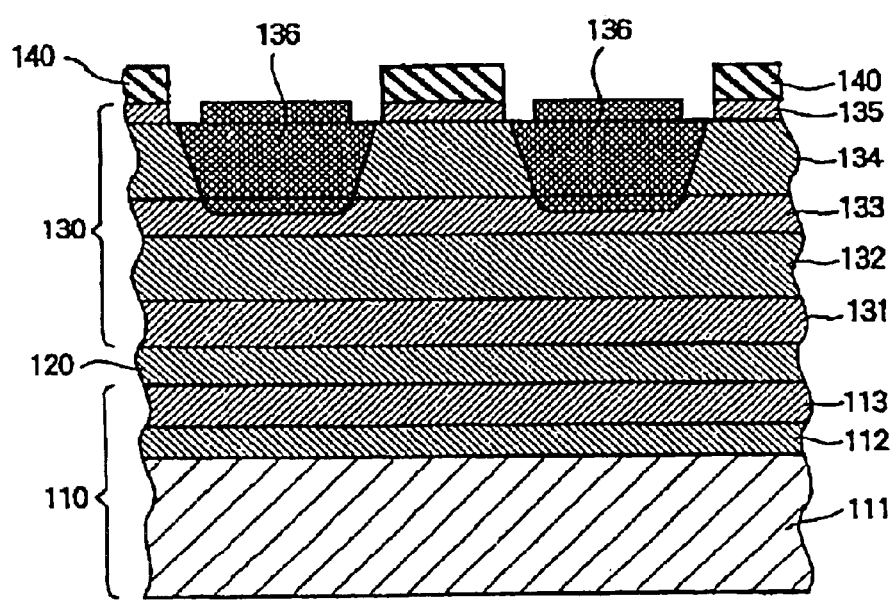
FIG. 10 is an enlarged view of a section A10 of FIG. 3.

AS shown in FIG. 10, for formation of the LED in the epitaxial film 130, a p-type impurity of zinc (Zn) is diffused into the n-type $Al_yGa_{1-y}As$ layer 133, the n-type $Al_zGa_{1-z}As$ layer 134, and the n-type GaAs layer 135 by the solid phase diffusion method to form a Zn diffusion region 136. A diffusion source film is removed after the solid phase diffusion.

Then, the surface of the Zn diffusion region in the GaAs contact layer 135 is exposed. It is desirable that a region including PN-junction formed in the GaAs contact layer 135 is removed. By doing this, carrier injection through the PN-junction in the GaAs contact layer 135 can be prevented so that light emitting efficiency is increased. For preventing the short-circuit between PN caused by an electrode wiring, it is important that an inter-layer insulating film is provided to cover part (a region including and in the vicinity of the PN-junction region on the surface of $Al_zG_{1-z}As$ layer) of the surface of the Zn diffusion region formed on the surface of and in the n-type $Al_zGa_{1-z}As$ layer 134 before providing a discrete electrode wiring. As stated above, in the first embodiment, an insulating film 140 is formed such that it covers the part (the region including and in the vicinity of the PN-junction region on the surface of the $Al_zGa_{1-z}As$ layer) of the surface of the Zn diffusion region formed on the surface of and in the n-type $Al_zGa_{1-z}As$ layer 134. The diffusion front of the Zn diffusion region 136 reaches the inside of the n-type $Al_yGa_{1-y}As$ layer 133 so that a minority carrier injected through the PN-junction is confined in the n-type $Al_yGa_{1-y}As$ layer 133, which gains a high emitting efficiency. That is, by creating a structure as shown in FIG. 10, it is possible to make the thickness of the epitaxial film 130 thinner by approximately 2 μm and increase the light emitting efficiency. The epitaxial layer may be made up by heterojunction-type LED instead of homojunction-type LED described above. Here, the homojunction-type means that a PN-junction is formed in a single semiconductor layer, and includes the case of the first embodiment wherein the second conductive type impurity is selectively doped into the first conductive type semiconductor layers. The heterojunction-type means that a PN-junction is formed in the interface between different conductive-type semiconductors, which includes, for example, that the n-type $Al_xGa_{1-x}As$ layer 132 and a p-type $Al_yGa_{1-y}As$ layer are grown to stack by epitaxial growth.

Figure 4:
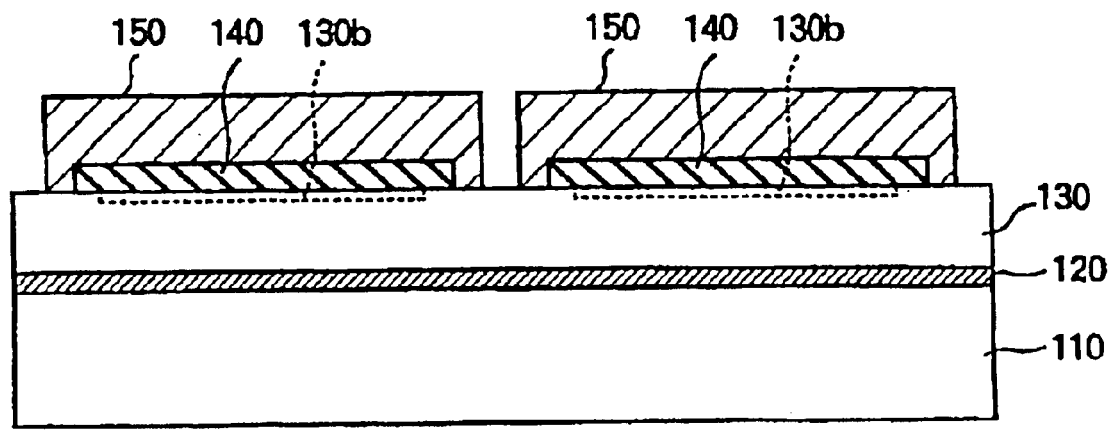
FIG. 4 is a sectional view of the LED/driving IC complex chip of FIG. 1, showing the fourth part of process of manufacturing the composite chip.

In FIG. 4, a protection layer 150 is formed in a region such that it covers the dielectric film 140 on the epitaxial film 130. It is preferable that the protection layer 150 is made of such a material as has etching-resistance property against etchant used in the steps of forming an etching groove and etching the separation layer 120. The protection layer 150 is made of an organic material, such as a polymer material and wax material for resist. By using the resist material for the protection layer 150, the protection layer 150 can be formed to a desired pattern in photolithography process for the use as an etching mask.

Figure 5:
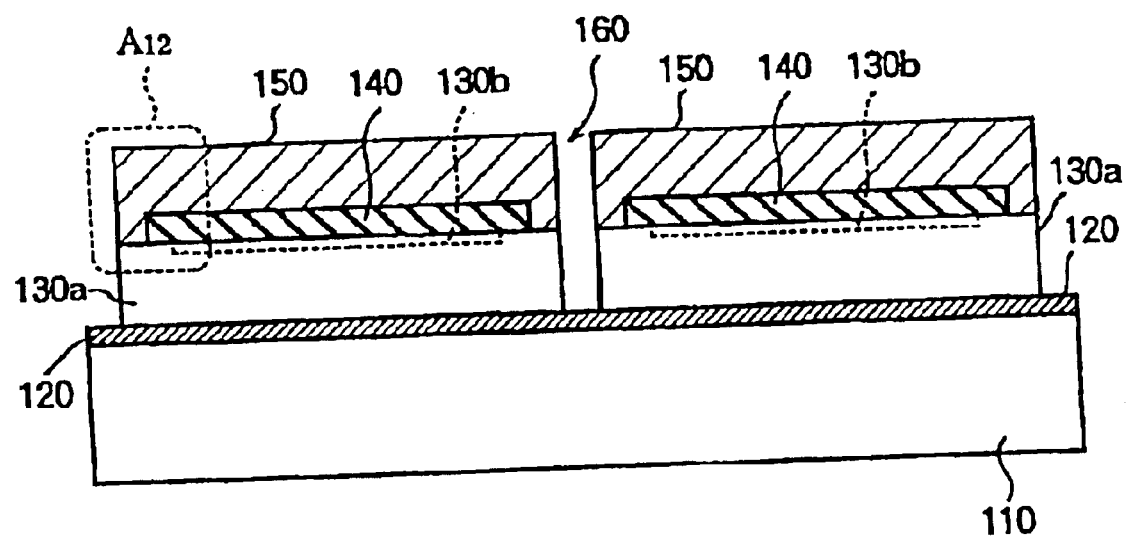
FIG. 5 is a sectional view of the LED/driving IC complex chip of FIG. 1, showing the fifth part of process of manufacturing the composite chip.
Figure 11:
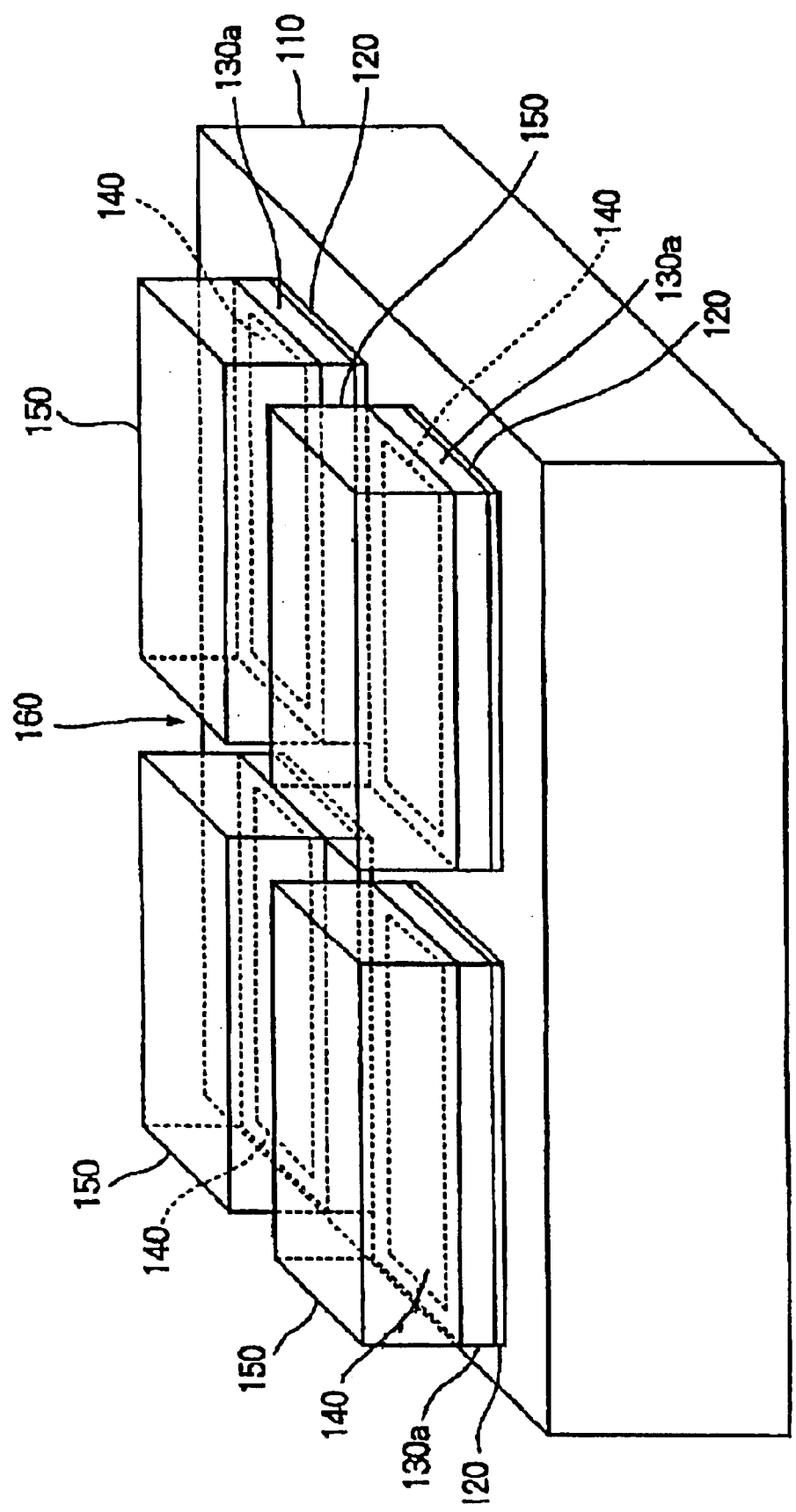
FIG. 11 is a schematic perspective view of FIG. 5.

In FIGS. 5 and 11, part of the epitaxial film 130, which is not covered by the protection layer 150, is etched by using an etchant up to the separation layer 120 to form the an etching groove 160 so that the epitaxial film 130 is divided into discrete epitaxial films 130a. Hydrophosphoric (solution containing phosphoric acid and hydrogen peroxide) is used for the etchant. However, solution containing citric acid and hydrogen peroxide may be use for the etchant.

Figure 6:
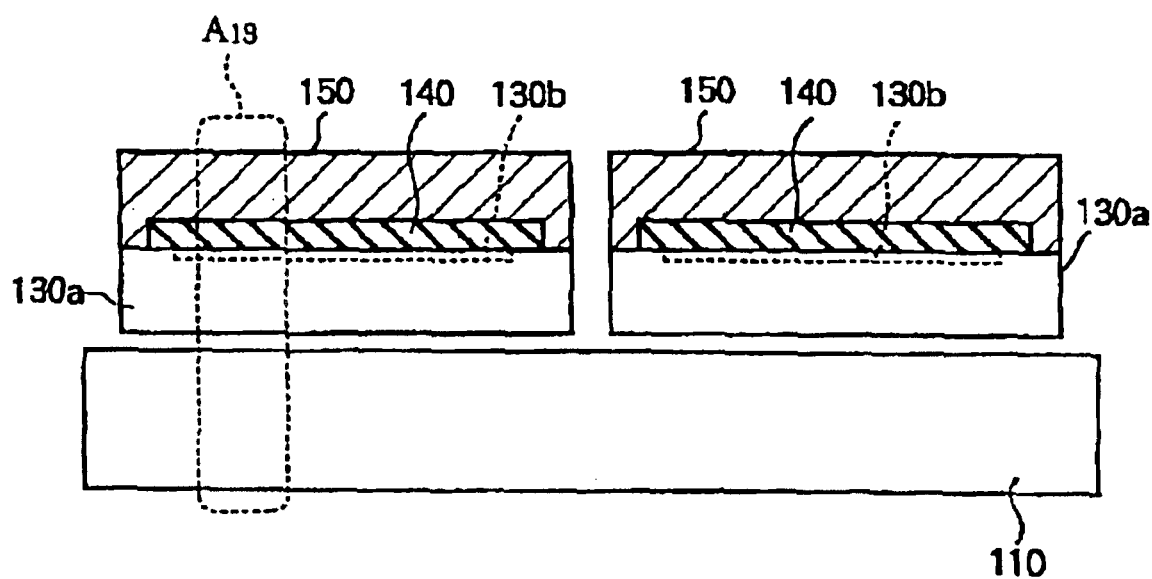
FIG. 6 is a sectional view of the LED/driving IC complex chip of FIG. 1, showing the sixth part of process of manufacturing the composite chip.
Figure 13:
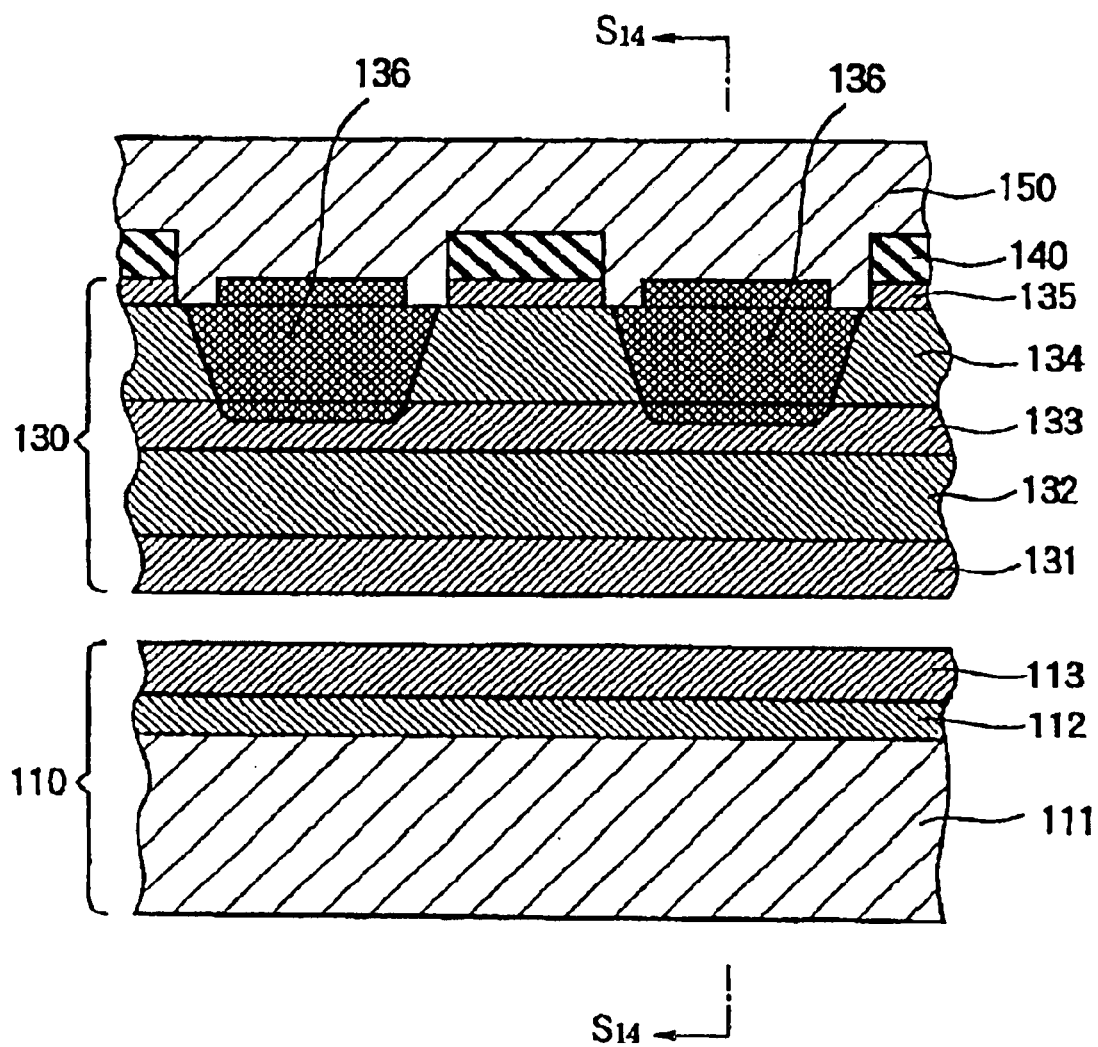
FIG. 13 is an enlarged view of a section 13A of FIG. 5.
Figure 14:
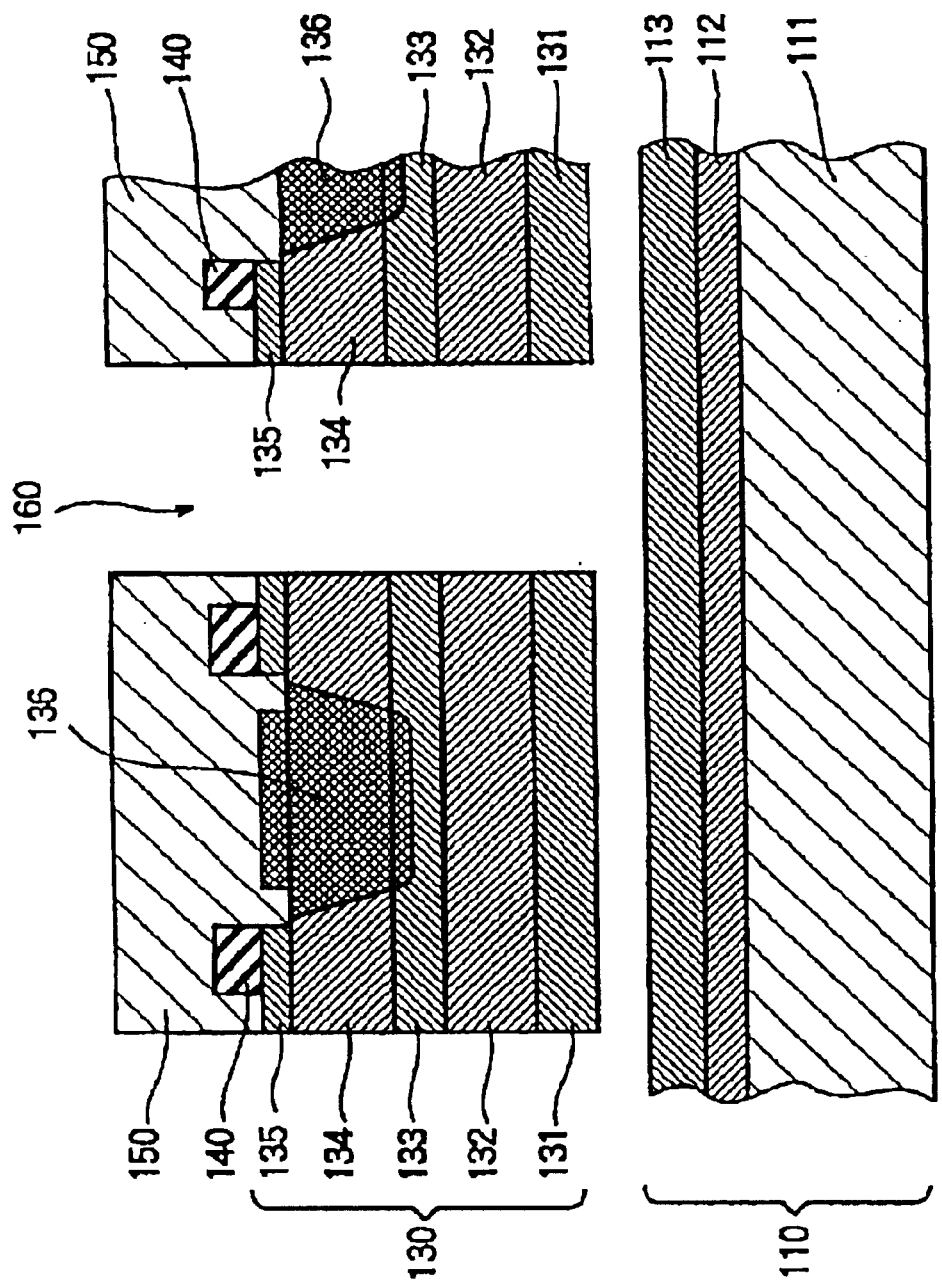
FIG. 14 is a schematic sectional view of FIG. 13 taken along the line S14—S14.

In FIGS. 6, 13, and 14, the separation layer 120 under the epitaxial film 130a is etched away using an etchant to make it possible to separate the epitaxial film 130a. Diluted hydrogen fluoride (10% HF solution) is used for the etchant.

Figure 12:
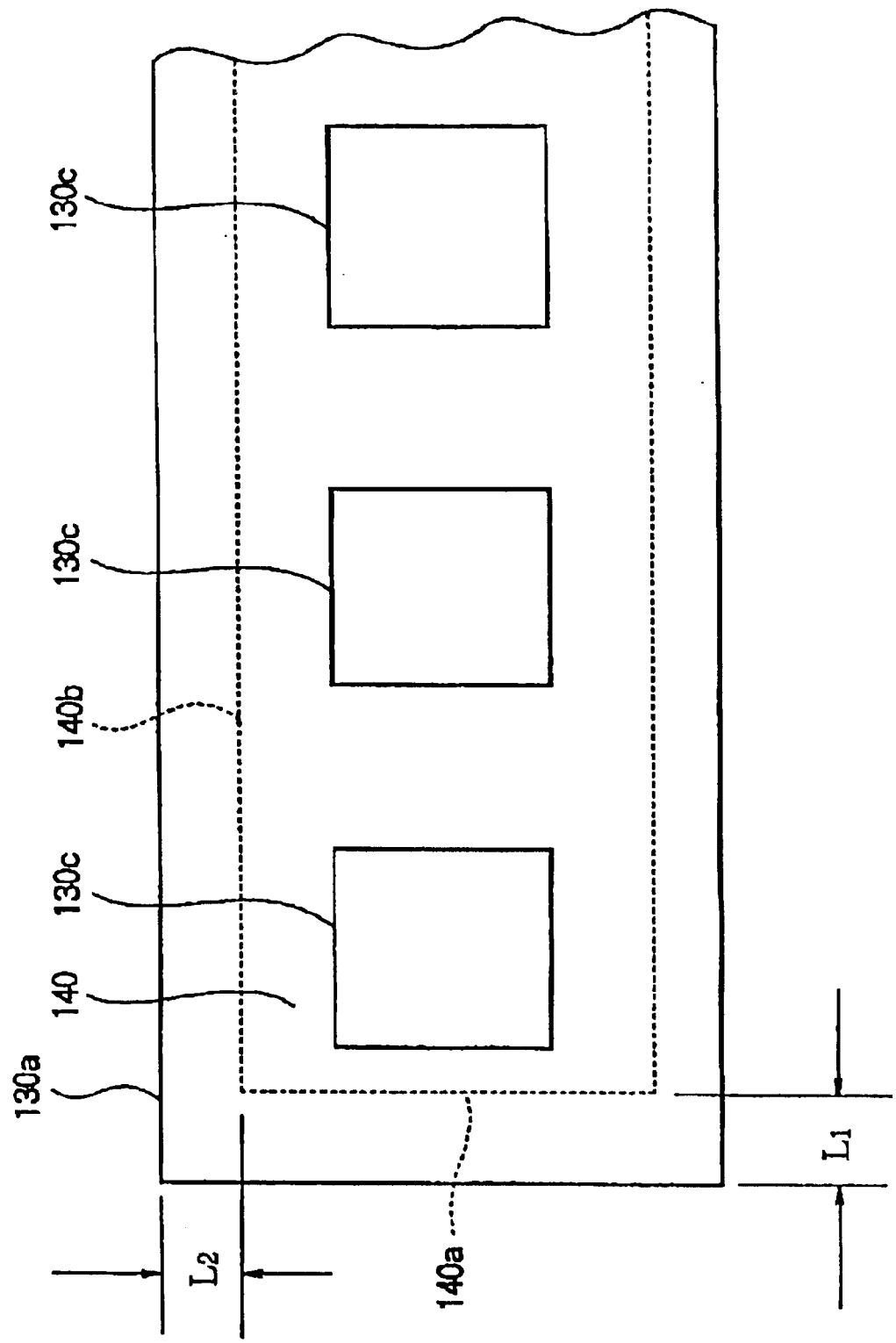
FIG. 12 is an enlarged top view of a section 12A of FIG. 5.

In FIG. 12, a short side 140a of the dielectric film 140 is located at an inner position by a distance L1 from a short side of the epitaxial film 130a. A longitudinal side 140b of the dielectric film 140 is locates at an inner position by L2 from a longitudinal side of the epitaxial film 130a. The distances L1 and L2 may be determined by (1) kind and property of the etchant (dry gas in case of dry etching), (2) etching time, (3) material of the dielectric film 140, and (4) material and thickness of the protection layer 150. However, they must be sufficiently large to the extent that the etchant does not reach the dielectric film 140 through the protection layer 150.

Figure 7A:
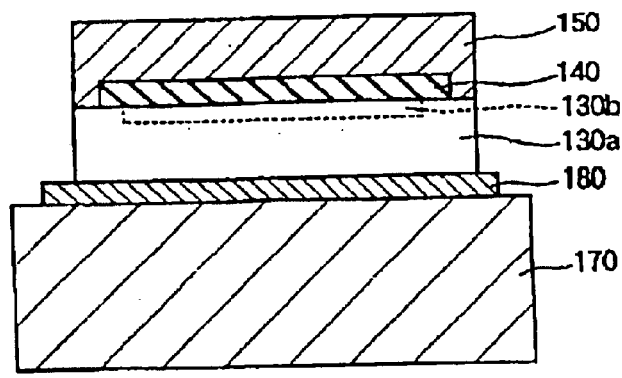
FIGS. 7(a) and 7(b) are a sectional view and a top view of the LED/driving IC complex chip of FIG. 1, showing the seventh part of process of manufacturing the composite chip.
Figure 7B:
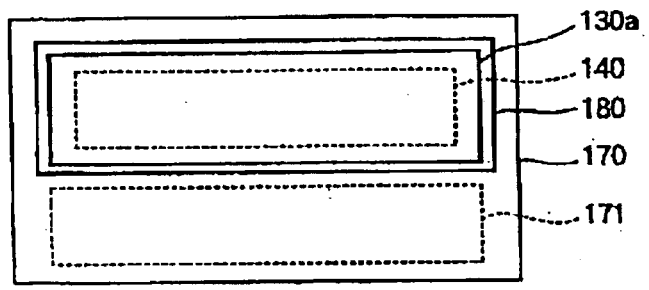

In FIGS. 7(a) and 7(b), a silicon substrate 170 on which a semiconductor circuit 171 is formed is prepared and a metal layer 180 is formed on the silicon substrate 170 in close to the semiconductor circuit 171. Then, the discrete epitaxial film 130a, which is separatable by the manufacturing process in FIG. 6, is adhered onto the metal layer 180. For holding and transporting the discrete epitaxial film 130a to a predetermined position for adhesion, aligning the position, and putting the discrete epitaxial film on a predetermined position, it is required to reversibly and repeatedly absorb to chuck or detach the epitaxial film to or from a transportation jig. Such a method includes, for example, absorption by barometric difference, magnetic absorption, electric absorption, and adhesion by bonding agent. The step of removing the protection layer 150 is performed before or after the step of adhering the epitaxial film 130a onto the silicon substrate 170. It should be preferably performed after the removal step of the protection layer 150.

When the thickness of the epitaxial film 130a is large, it is possible that the discrete wiring layer 190 has a bench-cut at the edge region of the epitaxial film 130. It is preferable that the thickness of the epitaxial film 130 is controlled to be 10 µm or smaller. As an alternative method, however, if the stepped region is made flat using polyimide and so forth to prevent the disconnection of a wire across the stepped region, the thickness of the epitaxial film 130 may be greater than 10 µm.

The metal layer 180 is made of palladium or gold, or a laminated layer of palladium and gold. The metal layer 180 has functions to fix the epitaxial film 130a in close to the semiconductor circuit 171, and electrically connect a common terminal region (not shown) under the epitaxial film 130a and a common terminal region (not shown) of the silicon substrate 170. It is preferable that ohmic contact is provided between the metal layer 180 and a common terminal region in the epitaxial film 130a, and the metal layer 180 and a common terminal region of the silicon substrate 170. Here, the common terminal region in the LED epitaxial film 130 is the entire epitaxial layer which contacts the metal layer 180. In this embodiment, it is the entire surface of the n-type GaAs layer 131 on the side of the common electrical potential (side of n-electrode). Also, the common terminal region of the silicon substrate 170 is the entire surface of the silicon substrate which contacts the metal layer 180. In this embodiment, it is a region on the side of common electrical potential (side of n-electrode) for driving the LED. The metal layer 180 is connected to the common electrical potential terminal of the semiconductor circuit for driving the device by any means, for example, by a metal wire. The metal layer 180 may be formed in the region of the silicon substrate 170, in which the semiconductor circuit 102 is formed, via an insulating film (not shown) such that the metal layer 180 is overlapped partly or entirely with the semiconductor circuit.

Figure 8:
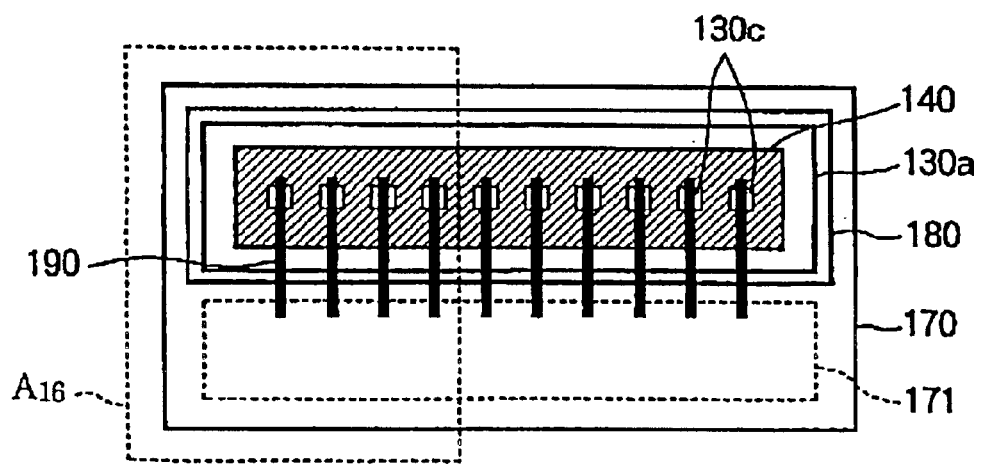
FIG. 8 is a top view of the LED/driving IC complex chip of FIG. 1, showing the eighth part of process of manufacturing the composite chip.
Figure 15:
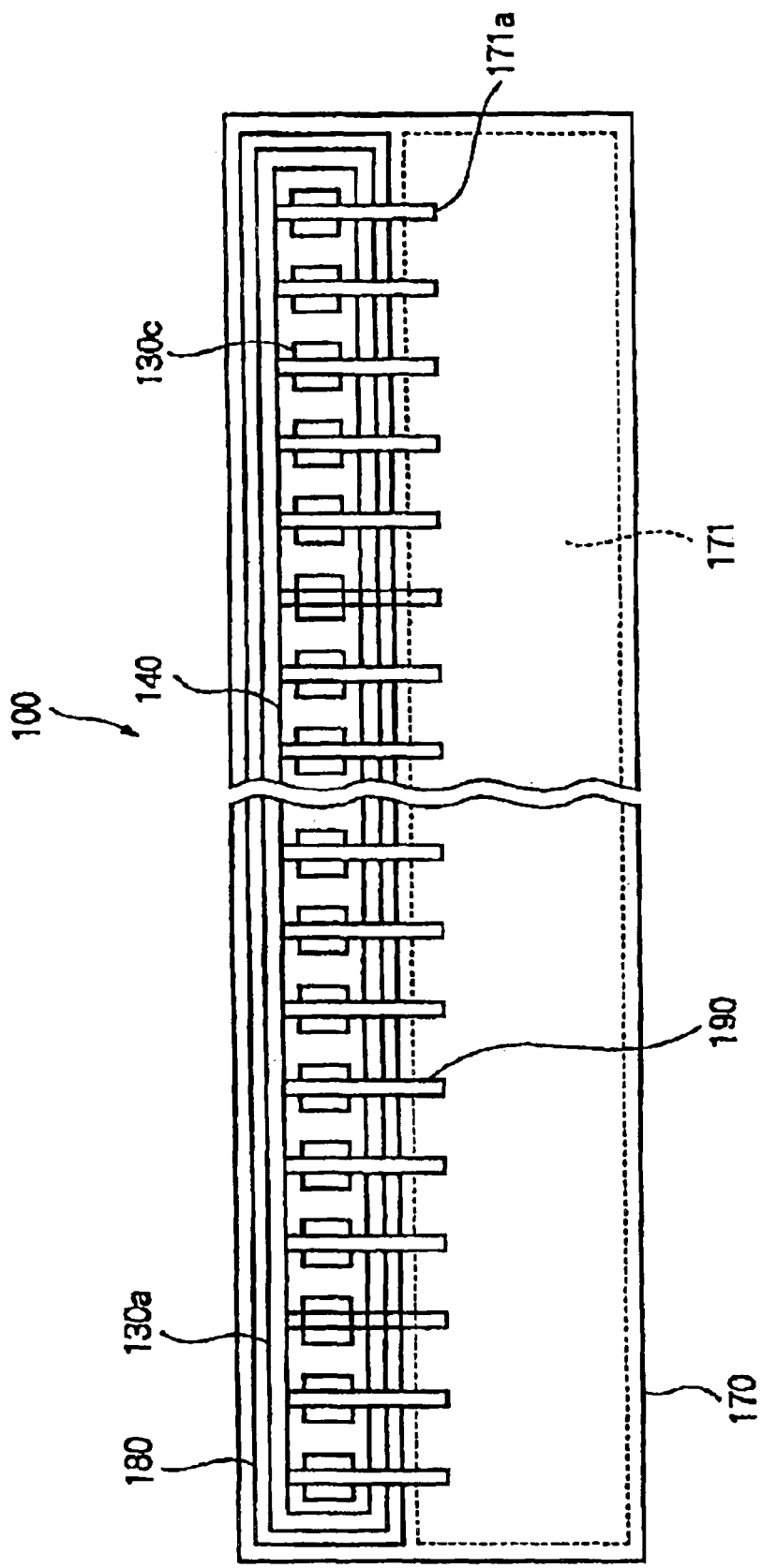
FIG. 15 is an enlarged top view of FIG. 8.
Figure 16:
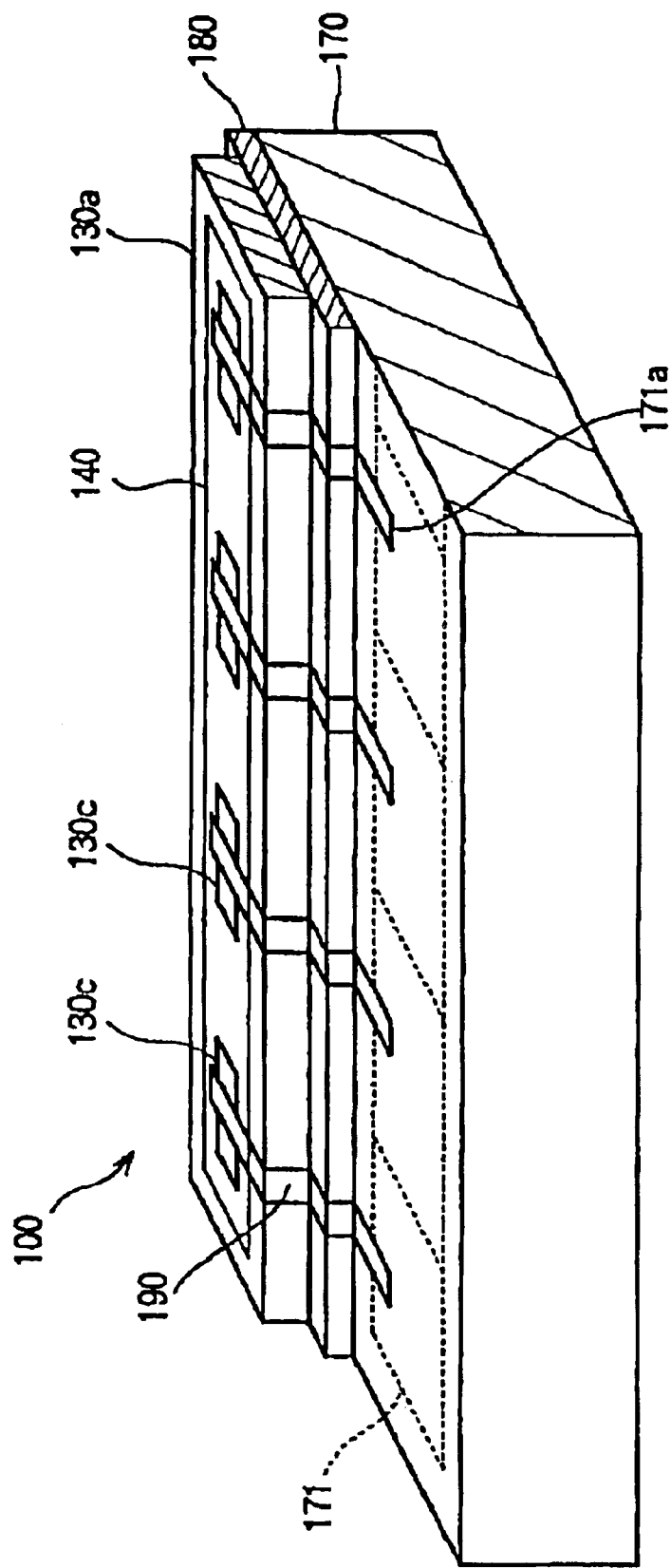
FIG. 16 is a schematic perspective view of a section A16 of FIG. 8.

In FIGS. 8, 15, and 16, the discrete wiring layer 190 is formed such that it extends from an LED 130c through the dielectric film 140 and other dielectric film which covers the top surface of the epitaxial film 30, the metal layer, and the silicon substrate (not shown), to a terminal region 171a formed on the semiconductor circuit 171 on the silicon substrate 170 to electrically connect the LED 130c and terminals in the terminal region 171a. Here, part (a region including and in the vicinity of the PN-junction on the surface of the $Al_zGa_{1-z}As$ layer) of the surface of the Zn diffusion region is covered with the insulating film 140 before forming the discrete wiring layer 190, wherein the Zn diffusion region is formed on the surface of the n-type $Al_zGa_{1-z}As$ 134 and in the $Al_zGa_{1-z}As$, which has been exposed when a region including the PN-junction region formed in the GaAs layer 135 by the Zn diffusion is removed, and an island-shaped GaAs layer carrying the diffused Zn is formed. The discrete wiring layer 190 is, for example, a metal wire of thin film. The material of the metal layer 190 is any one material or a combination of a plurality of materials selected from the group including an Au layer, Ti/Pt/Au laminated layer, Au/Zn laminated layer, Au/Ge laminated layer, Ni/Au laminated layer, AuGeNi/Au laminated layer, Pd layer, Pd/Au laminated layer, Mg/Au laminated layer, Al layer, Al/Ni laminated layer, polysilicon layer, ITO layer, and ZnO layer.

It is preferable that the discrete wiring layer 190 is formed collectively by photolithography. Since the discrete wiring layer 190 forms a wiring of a thin film, when the wiring is long, the voltage drop of the wiring becomes large. Also, when a plurality of the LEDs 130c are arranged with high density, the pitch of the LEDs 130c is fine so that the width of the discrete wiring layer 190 is controlled to be small. For example, when the width and thickness of the discrete wiring layer 190 are 5 µm and 0.5 µm, respectively, and the driving current is several mA, it is desirable that the length of the discrete wiring layer is less than approximately 200 µm.

As describe above, according to the first embodiment of the invention, the epitaxial film 130 adhered on the silicon substrate 170 via the metal layer 180 is electrically connected to the semiconductor circuit 171 formed on the silicon substrate 170 by the discrete wiring layer 190 of a thin film formed by photolithography so that it is not required that the epitaxial film 130*a* is provided with electrode pads for wire bonding. Consequently, the epitaxial film 130*a* is made small so that the LED/driving IC composite chip 100 is miniaturized. Also, since the epitaxial film 130 is made small, the material cost is reduced.

According to the first embodiment of the invention, the epitaxial film 130 adhered on the silicon substrate 170 is electrically connected to the semiconductor circuit 171 formed on the silicon substrate 170 by the discrete wiring layer 190 of a thin film formed by photolithography so that it is not necessary to make large the thickness of the epitaxial film 130*a* for wire bonding. Thus, the thickness of the epitaxial film 130*a* can be made small so that the material cost is reduced.

According to the first embodiment of the invention, the sides 140*a* and 140*b* of the dielectric film 140 are located at an inner position with respect to the side of the epitaxial film 130*a*, and these films are covered with the protection layer 150. Then, the predetermined region for the etching groove 160 and the separation layer 120 are etched away. Consequently, the LED 130*c* (light emitting region) in the separated epitaxial film 130*a* and the dielectric film 140 on the epitaxial film 130*s* are not damaged by etchant, thus making it possible to divide the epitaxial film 130 into the separatable epitaxial films 130*a*.

(Second Embodiment)

Figure 17:
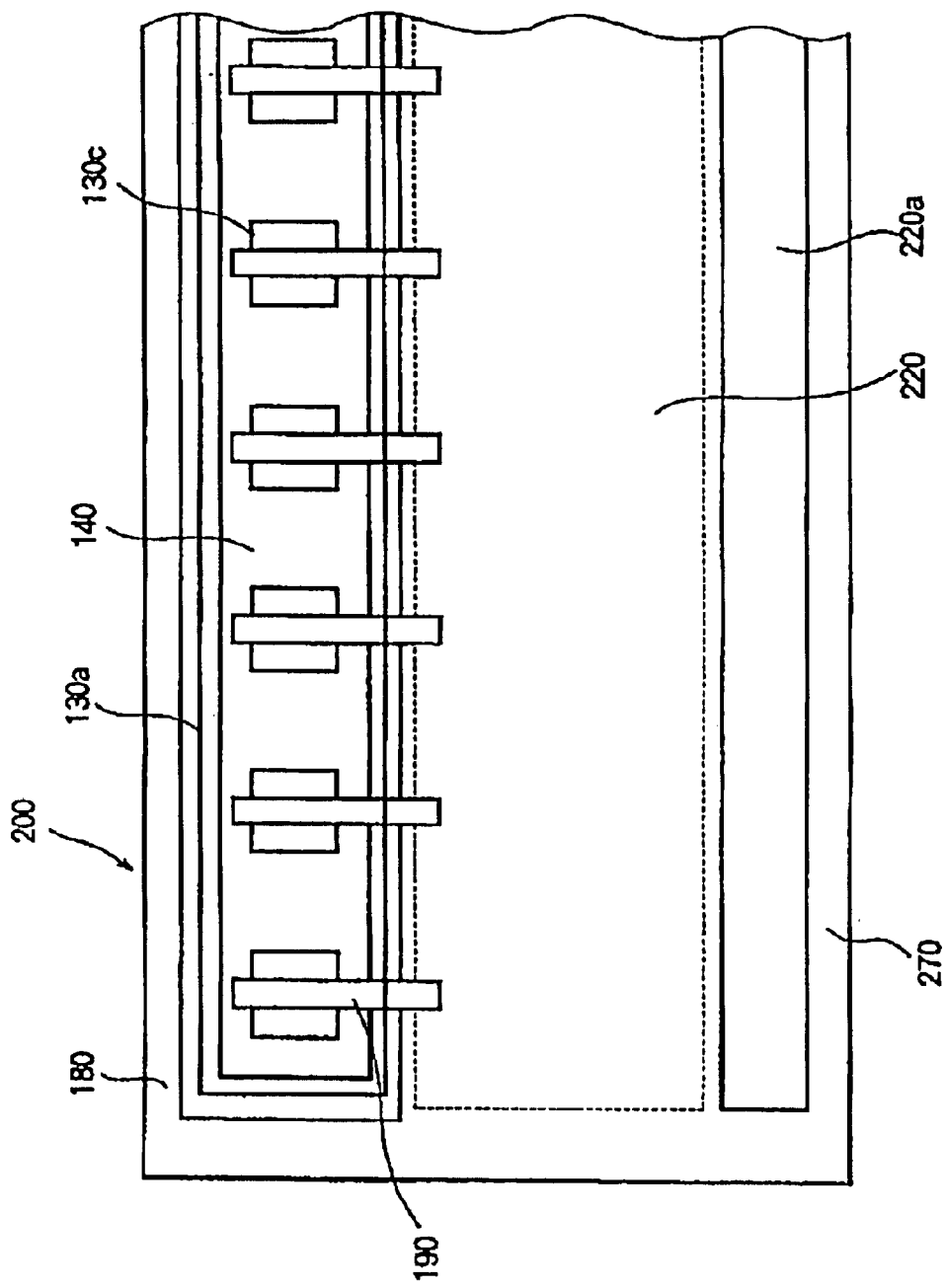
FIG. 17 is a schematic top view of an LED/driving IC composite chip manufactured by a method according to the second embodiment of the present invention.

In FIG. 17, the same reference numerals are provided for elements which is identical with or corresponding to those in FIG. 15 (the first embodiment). A different point between an LED/driving IC composite chip 200 of the second embodiment and the composite chip 100 of the first embodiment is that in the composite chip 200, a thin film 220 carrying a semiconductor circuit (herein after "semiconductor circuit thin film") is adhered on a substrate 270 and connected to a wiring region 220*a* provided on the substrate 270 by a discrete metal film wirings (not shown). The substrate 270 is made of, for example, an insulating substrate, such as a glass substrate, a plastic substrate, a polymer sheet, a substrate containing an oxide or nitride, a semiconductor substrate, such as a silicon substrate, and a metal, such stainless steel, copper, and aluminum. When a metal substrate is employed, it become an insulating substrate having a good radiation characteristic by providing oxidation treatment for the surface thereof or a coating layer thereon. If the metal substrate is not insulated, it can be a common wiring layer. It is possible to form one or a plurality of epitaxial films 130*a* and one or a plurality of the semiconductor circuit thin films 220 for driving a semiconductor element in the epitaxial film. A plurality of connection pads or a wiring pattern is formed in the wiring region 220*a*. The connection pads or the wiring pattern is provided for electrically connecting input/output terminals of the semiconductor circuit thin film 220 to external circuits in order to input and/or output signals and a power source. One or a plurality of semiconductor circuits may be provided instead of the wiring region 220*a* or between the semiconductor circuit thin film 220 and the wiring region 220*a*, and connected with the semiconductor circuit thin film 220 by the discrete metal thin film.

A SOI substrate (SOI wafer) 210 is used for manufacturing the semiconductor circuit thin film 220. The SOI substrate 210 is composed of a silicon substrate 211, a buried $SiO_2$ layer (BOX layer) 212 formed on the silicon substrate 211, and a silicon layer (SOI layer) 213 formed on the $SiO_2$ layer 212. The semiconductor circuit thin film 220 is manufactured as follows.

Figure 18A:
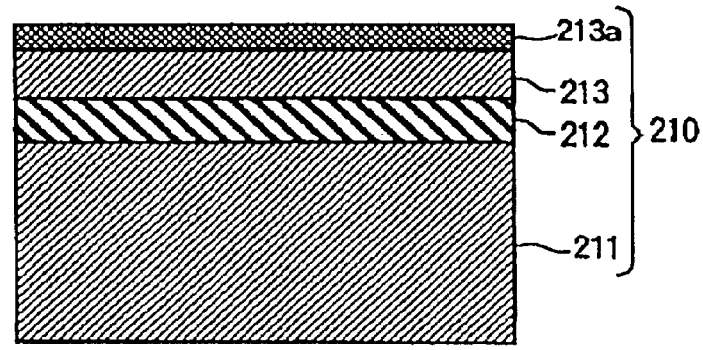
FIGS. 18(a) to 18(c) are sections views showing the outline of manufacturing process of a semiconductor thin film according to the second embodiment of the present invention.
Figure 18B:
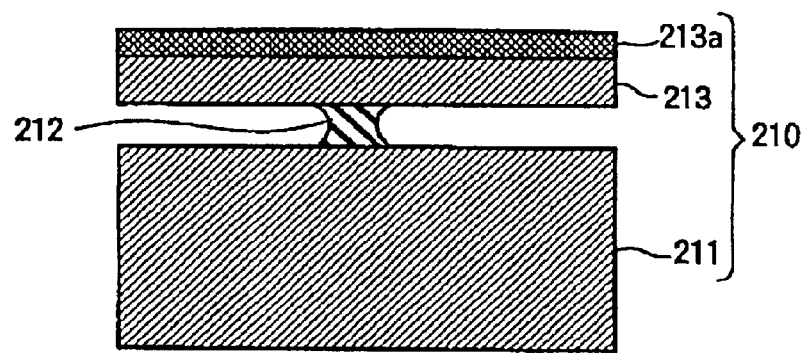
Figure 18C:
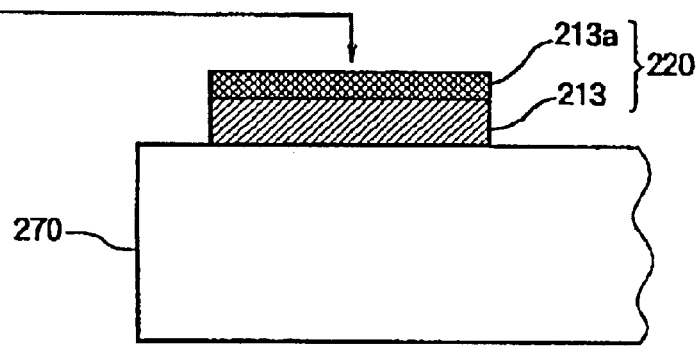

In FIG. 18(*a*), a semiconductor circuit 213*a* is formed in the vicinity of the surface of the silicon layer 213. FIG. 18(*b*), the $SiO_2$ layer 212 is etched by HF liquid or gas. In FIG. 18(*c*), the silicon layer 213 is separated and adhered onto the substrate 270. For a method of holding the silicon layer 213, a reversible method (for example, absorption by barometric difference, magnetic absorption, electric absorption, and adhesion by bonding agent) is used. In actual production, the steps of forming many semiconductor circuit thin films 220 on the SOI substrate 210 and separating the respective semiconductor circuit thin film to discrete semiconductor circuit tin films 220 are included. It is desirable that the manufacturing process of the semiconductor circuit thin film 220 includes, in the same way as in the manufacturing process of the epitaxial film 130*a*, the step of forming a protection film so that the dielectric films and metal wiring films formed on the surface of the semiconductor circuits are not damaged by etchant used in etching process for dividing the semiconductor circuit thin film 220 into the discrete semiconductor circuit thin films 220 and separating the discrete semiconductor circuit thin films 220. For the protection film, a material having an etching resistance property, which was described above with respect to the formation of the epitaxial film 130*a*, may be used.

According to the second embodiment of the invention, the same effects as in the first embodiment are obtained. The second embodiment is the same as the first embodiment except the above-mentioned points. By using the semiconductor circuit thin film 220, the metal thin film wiring can provide electrical connection between the electrode pads on the thin film semiconductor circuit 220 and the wiring region 220*a* on the substrate 270. Moreover, the metal thin film wiring replaces the bonding wires for inputting electrical signals and electric power to the circuits, wherein the metal thin film wiring can be formed by wafer-level manufacturing process.

(Third Embodiment)

Figure 19:
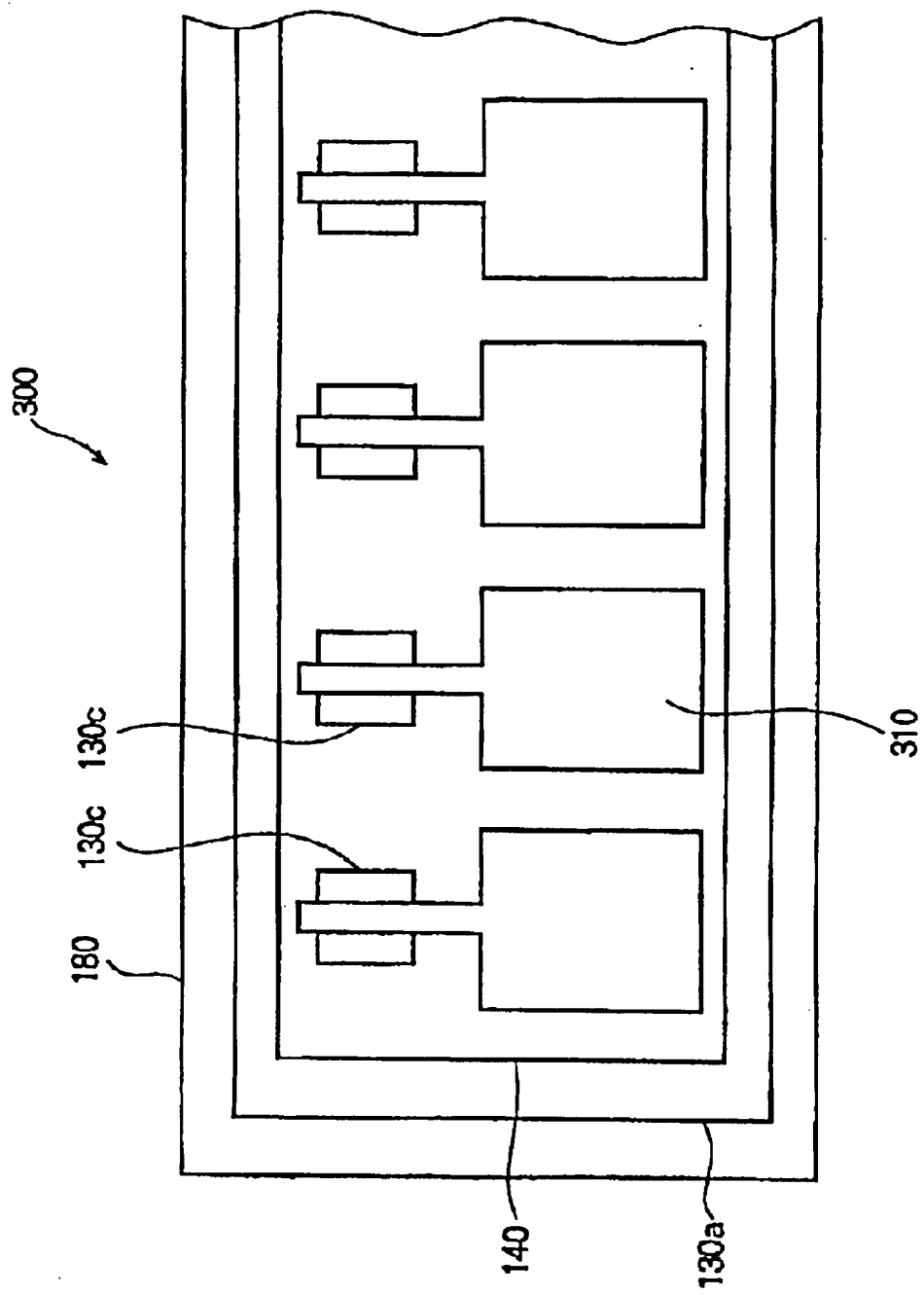
FIG. 19 is a schematic top view of an LED/array chip manufactured by a method according to the third embodiment of the present invention.

In FIG. 19, the same reference numerals are provided for elements which is identical with or corresponding to those in FIG. 15 (the first embodiment). A different point between an LED/driving IC composite chip 300 of the third embodiment and the composite chip 100 of the first embodiment is that in the third embodiment, the light emitting regions (LEDs) 130*c* and electrode pads 310 electrically connected to the light emitting regions 130*c* are formed on the dielectric layer 140. In this case, a wire bonding is used for an electrical connection with the respective LEDs 130*c*.

According to the third embodiment, the composite chip 300 comprise the electrode pads 310 so that the epitaxial film 130 has a large size. However, the sides of the dielectric film 140 is located in a position inner from the sides of the epitaxial film 130*a* and the protection layer 150 covers theses films before the step of etching. Accordingly, the LEDs 130*c* (light emitting regions) and the dielectric film 140 in the separated epitaxial film 130*a* are not damaged by etchant, thus enabling the division of the epitaxial film 130 into the discrete epitaxial films 130*a*. The third embodiment is the same as the first and second embodiments except the above-mentioned points.

(Fourth Embodiment)

Figure 20:
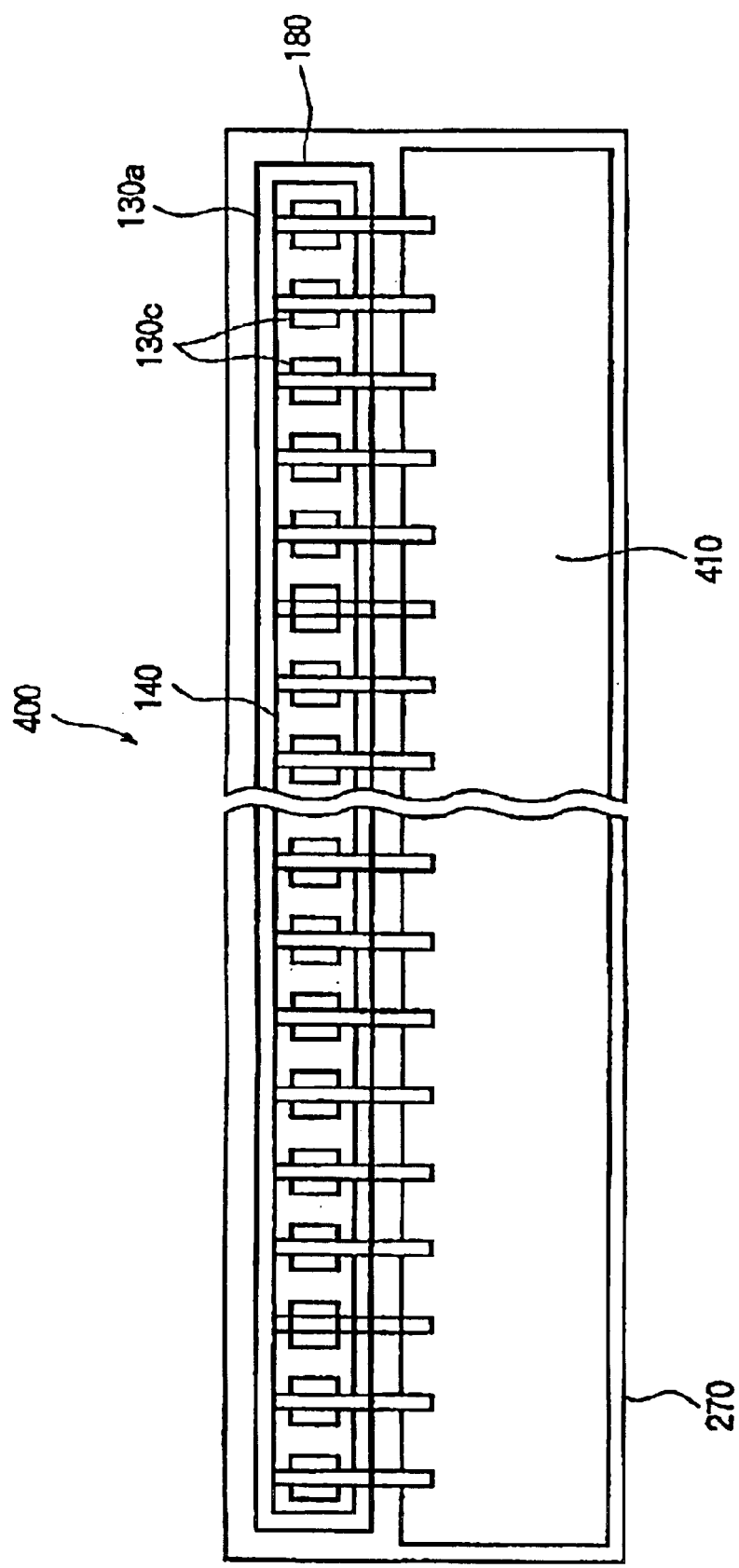
FIG. 20 is a schematic top view of an LED/driving IC composite chip manufactured by a method according to the fourth embodiment of the present invention.
Figure 21:
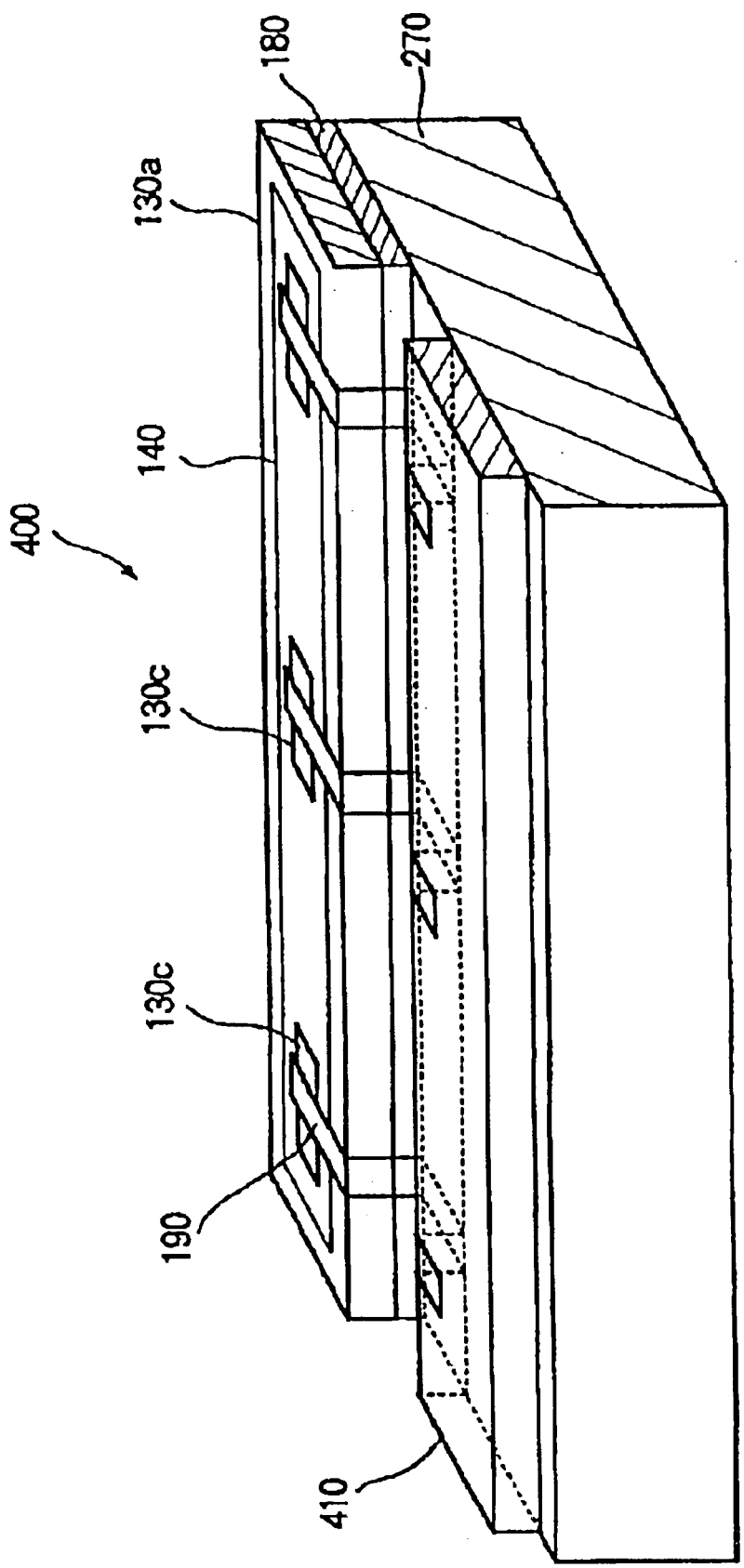
FIG. 21 is a schematic perspective view of a portion of FIG. 20.

In FIG. 20, the same reference numerals are provided for elements which is identical with or corresponding to those in FIG. 15 (the first embodiment). In FIG. 21, the same reference numerals are provided for elements which is identical with or corresponding to those in FIG. 16 (the first embodiment). A different point between an LED/driving IC composite chip 400 of the forth embodiment and the composite chip 100 of the first embodiment is that in the forth embodiment, a semiconductor circuit thin film 410 is adhered to the substrate 270 instead of the semiconductor circuit 171 of the first embodiment. In the fourth embodiment, the semiconductor circuit thin film 410 contains a wiring region to make connection between an outer circuit and the semiconductor circuit thin film 410 by using the metal film wiring so that electrical signals and electric power are supplied to the semiconductor circuit from the outer circuit.

The method of manufacturing the semiconductor circuit thin film 410 is the same as that of the semiconductor circuit thin film 220 in FIG. 18. When the thicknesses of the epitaxial film 130a and the semiconductor circuit thin film 410 are large, the discrete wiring layer 190 is prone to have a bench cut. It is desirable that the thicknesses of the epitaxial film 130a and the semiconductor circuit thin film 410 are controlled to be approximately 10 μm or smaller. As an alternative method, however, if the stepped region is made flat using polyimide and so forth to prevent the disconnection of a wire across the stepped region, the thicknesses of the epitaxial film 130a and the semiconductor circuit thin film 410 may be greater than 10 μm. Connection pads for connection with outer circuits are provided in the semiconductor thin film 410 for input and/or output of signals for electric source and controls. According to the forth embodiment, the same effect in the first embodiment is obtained. The fourth embodiment is the same as the first to third embodiments except the above-mentioned points.

(Fifth Embodiment)

Figure 22:
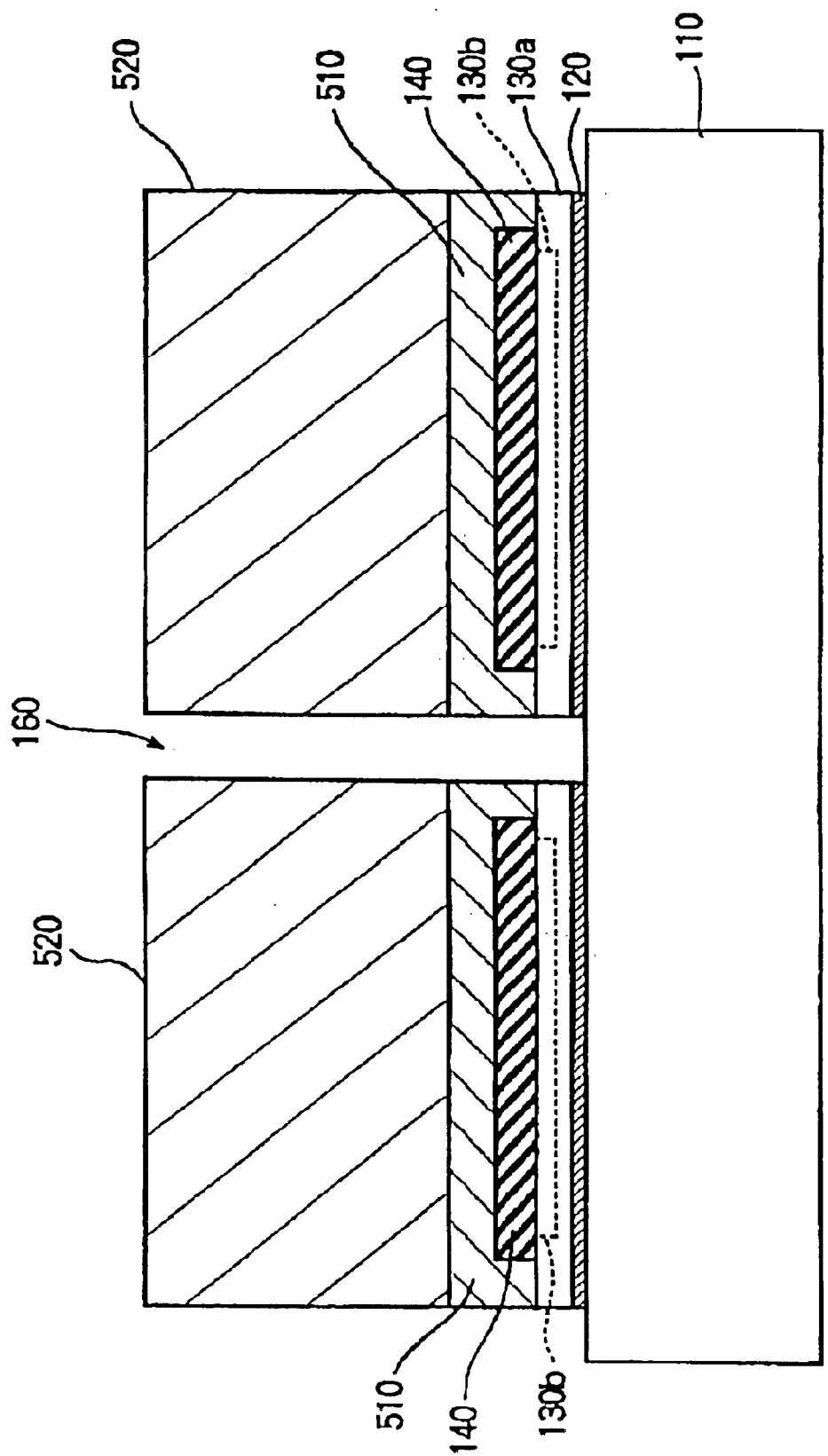
FIG. 22 is a sectional view of the LED/driving IC complex chip according to the fifth embodiment of the present invention, showing process of manufacturing the composite chip.
Figure 23:
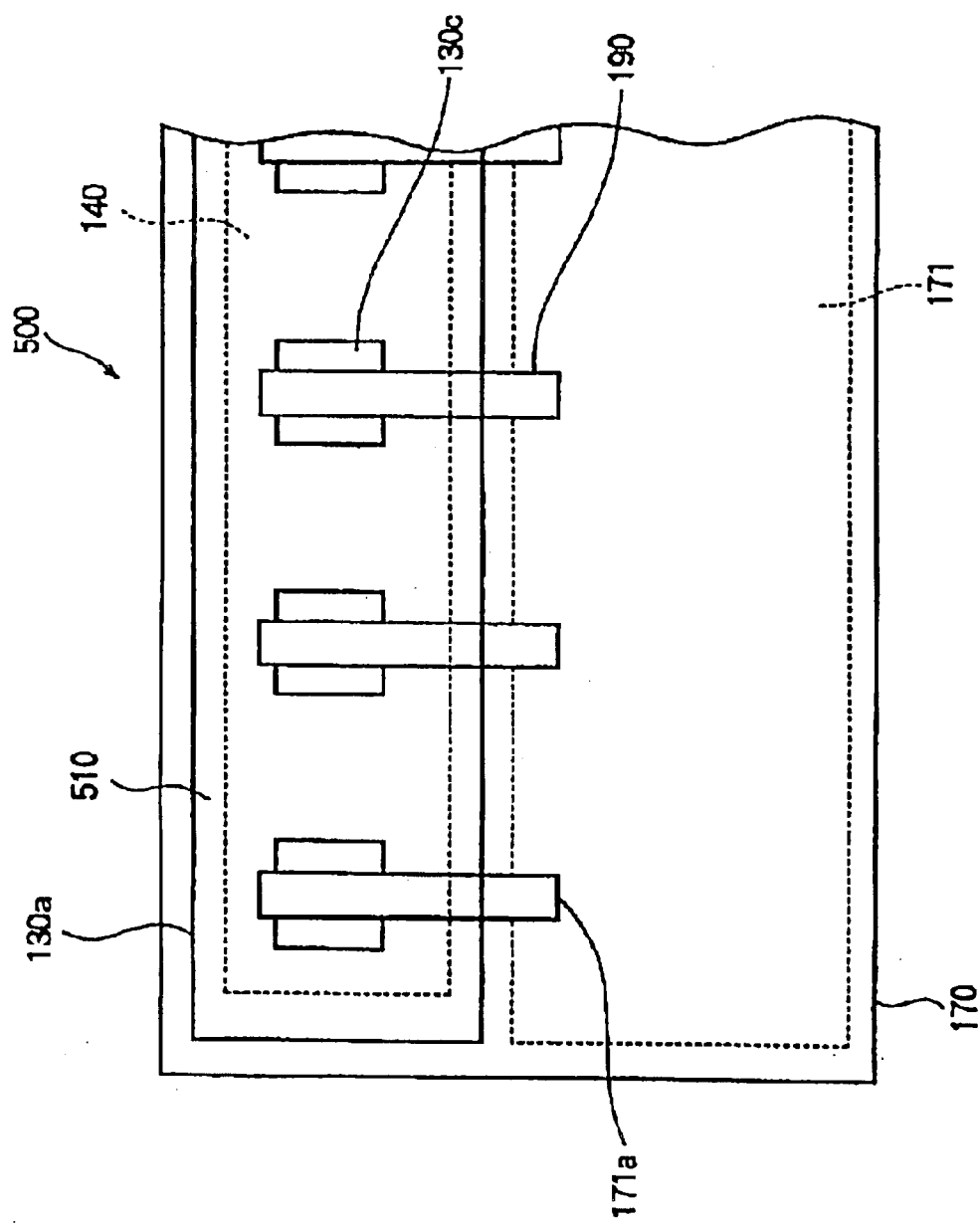
FIG. 23 is a schematic top view of a portion of an LED/array chip manufactured by a method according to the fifth embodiment of the present invention.

In FIG. 22, the same reference numerals are provided for elements which is identical with or corresponding to those in FIG. 5 (the first embodiment). In FIG. 23, the same reference numerals are provided for elements which is identical with or corresponding to those in FIG. 15 (the first embodiment). A different point of the fifth embodiment from the first embodiment is that the fifth embodiment comprises the steps of forming a passivation film 510 to cover the dielectric film 140 and forming a protection film 520 on the passivation film 510. Each of the protection and passivation films is made of material which has etching resistance property against etchant used in the steps of forming the etching grooves 160 and etching the separation layer 120.

Here, the etching resistance property of the passivation film 510 means that the function of the passivation film of covering and protecting the surface of the semiconductor thin film and the dielectric film is not damaged by followings:

1. The material of the passivation film 510 is not dissolved, decomposed, or broken by the etchant for the steps of forming the etching grooves and etching the separation layer.
2. The adhesion of the interface between the passivation film and the surface of the semiconductor circuit thin film is not damaged and the dielectric film 140 is not broken by the penetration of the etchant through the interface.
3. The adhesion of the interface between the passivation film and the surface of the semiconductor circuit thin film is not damaged and the dielectric film 140 is not broken by the penetration of the etchant through the passivation film up to the interface.

Also, the etching resistance property of the protection layer 520 means that the function of the protection layer of adhering to the surface of the passivation film and protecting the epitaxial film 130a is not damaged by followings:

4. The material of the protection layer is not dissolved, decomposed, or broken by the etchant for the steps of forming the etching grooves and etching the separation layer.
5. The adhesion of the interface between the protection layer and the surface of the passivation film is not damaged by the penetration of the etchant through the interface.
6. The adhesion of the interface between the protection layer and the surface of the passivation film is not damaged by the penetration of the etchant through the protection layer up to the interface.

The passivation film 520 is made of, for example, either polyimide or aluminum nitride. The protection layer 520 is made of an organic material, such as a polymer material and wax material for resist material. The protection layer 520 is removed before or after the step of adhering the epitaxial film 130a onto the silicon substrate 170. The protection film 520 is preferably removed after the stop of adhering the epitaxial film 130a onto the silicon substrate 170. The side of the passivation film 510 is located at the substantially same position as that of the discrete epitaxial film 130a.

According to the fifth embodiment, the same effect as in the first embodiment is obtained. According to the fifth embodiment, even when a defect, such as pin-hole, is produced in the protection layer 520, the dielectric film 140 is not damaged so that the device has high reliability. The fifth embodiment is the same as the first to fourth embodiments except the above-mentioned points.

(Sixth Embodiment)

Figure 24:
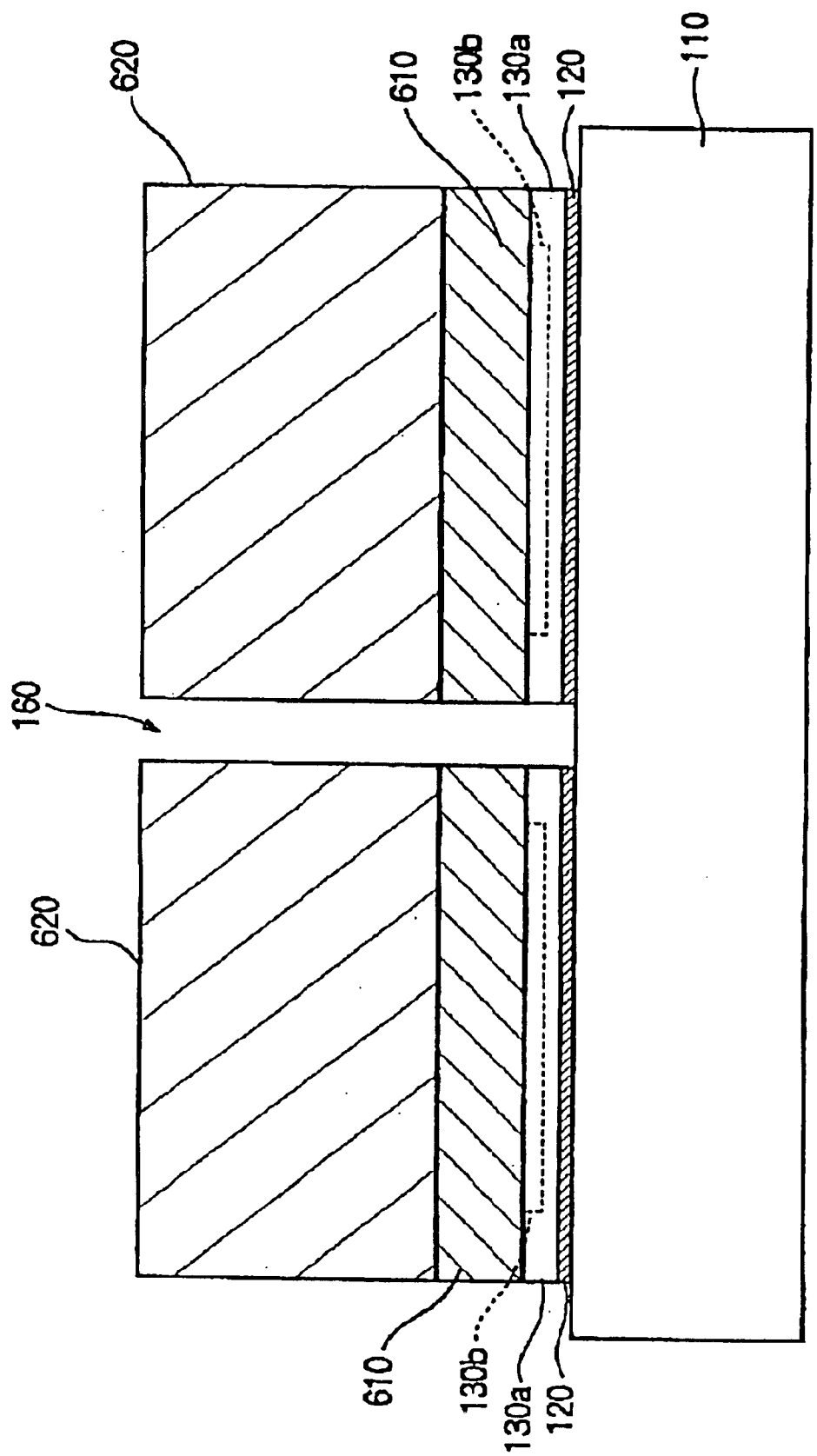
FIG. 24 is a sectional view of the LED/driving IC complex chip according to the sixth embodiment of the present invention, showing process of manufacturing the composite chip.

In FIG. 24, the same reference numerals are provided for elements which is identical with or corresponding to those in FIG. 22 (the fifth embodiment). A different point of the sixth embodiment from the fifth embodiment is that the sixth embodiment does not leave the dielectric film 140. In the sixth embodiment, an opening section is formed in a predetermined region for the light emitting section on the epitaxial film 130. After a dielectric film made of, for example, aluminum oxide, aluminum nitride, silicon oxide, or silicon nitride is formed, the impurity of Zn is diffused through the opening section by, for example, solid phase diffusion method and a diffused film and the dielectric film are removed. Then, a region including a PN-junction formed in a GaAs layer 135 by the Zn diffusion is removed. Then, for example, an insulating film including the opening section which exposes part of the surface of the island-shaped GaAs layer 135 with the diffused Zn is formed as passivation film 610. It is desirable that the passivation film 610 is formed such that the opening section of the passivation film 610 does not expose the surface of the n-type $Al_zGa_{1-z}As$ 114 and part of the surface of the Zn diffused region formed in the n-type. $Al_zGa_{1-z}As$ 114 (a region including and in the vicinity of the PN-junction in the surface of the n-type $Al_zGa_{1-z}As$ 114).

According to the sixth embodiment, unlike the fifth embodiment, the passivation film 610 and a protection layer 620 are formed without leaving the dielectric film 140. The protection layer 620 and the passivation film 610 are made of materials which have etching resistance property against etchant used in the steps of forming the etching groove 160 and etching the separation layer 120. The passivation film 610 is made of, for example, either polyimide or aluminum nitride. The protection layer 620 is made of, for example, a polymer material or a wax material for a resist material. The protection layer 620 is removed before or after the step of adhering the epitaxial film 130a onto the silicon substrate 170. The protection film 620 is preferably removed after the stop of adhering the epitaxial film 130a onto the silicon substrate 170. The side of the passivation film 610 is located at the substantially same position as that of the discrete epitaxial film 130a.

According to the sixth embodiment, the same effect as that in the first embodiment are obtained because the passivation film 610 has the function of the dielectric layer too. According to the sixth embodiment, even when a defect, such as pin-hole, is produced in the protection layer 620, the semiconductor element is not damaged so that the device has high reliability. The sixth embodiment is the same as the first to fourth embodiments except the above-mentioned points.

Figure 25:
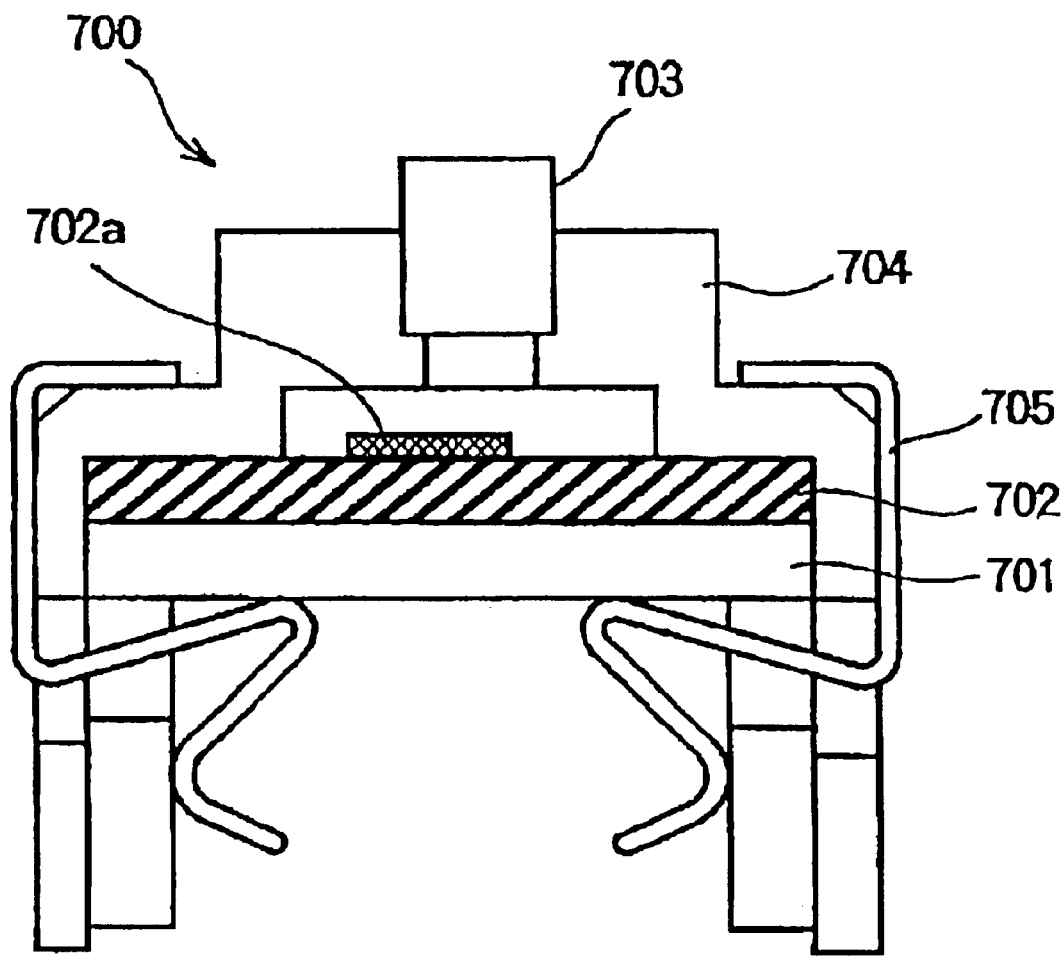
FIG. 25 is a schematic sectional view of an LED print head incorporating a device manufactured by a method according to the present invention.
Figure 26:
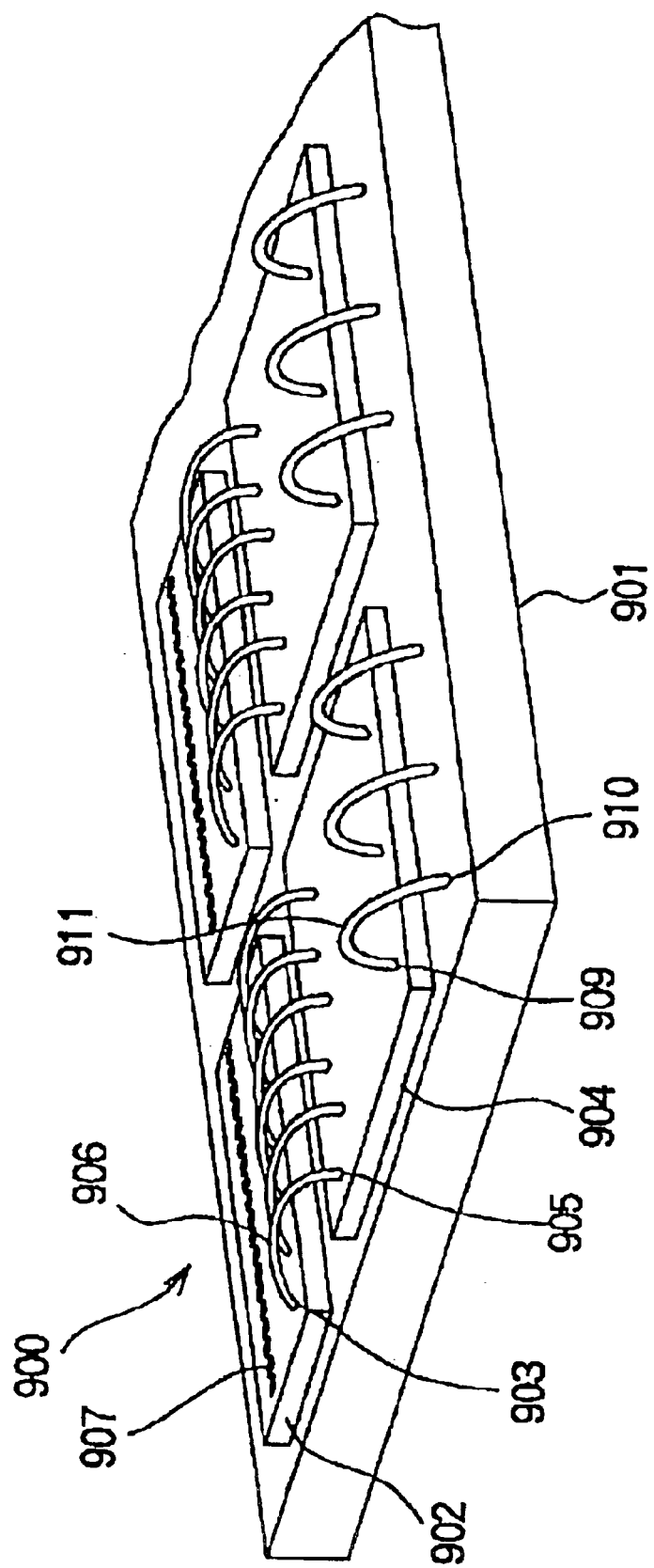
FIG. 26 is a schematic perspective view of a portion of an LED print head of the conventional art.
Figure 27:
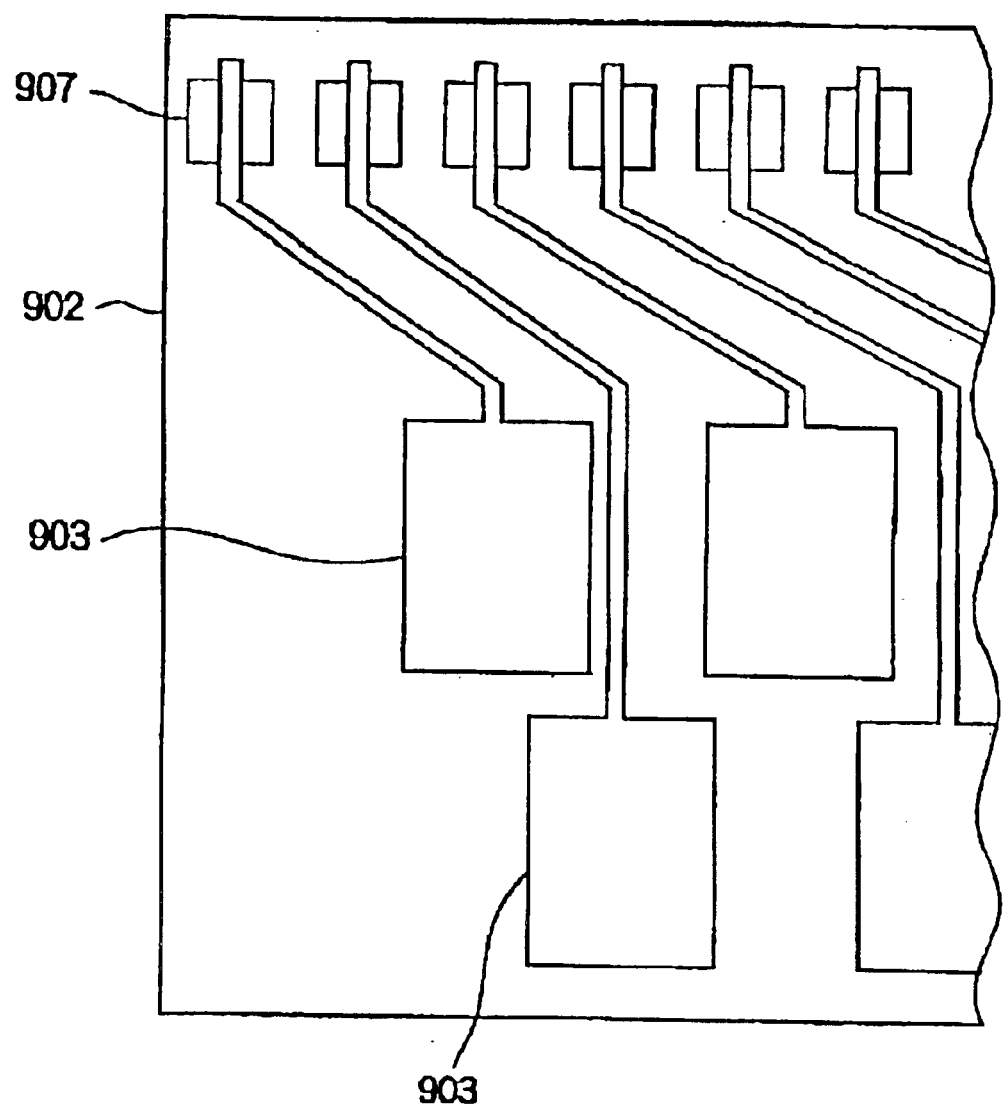
FIG. 27 is a top view of a portion of an LED array chip mounted in the LED print head of FIG. 26.

In FIG. 25, an LED print head 700 comprises a base member 701, an LED unit 702 fixed to the base member 701, a rod lens array 703 having a plurality of cylindrical optical elements arranged therein, a holder 704 for holding the rod lens array 703, and a clamp 705 for fixing the above elements 701 to 704. The LED unit 702 comprises a semiconductor device 702a or an LED/driving IC chip or an LED array chip manufactured according to the above-mentioned embodiments. Light emitted from the LED unit 702 is illuminated through the rod lens array 703. The LED print head 700 is applied to an exposing device in a photoelectronic printer and a photoelectronic copying machine.

In the above embodiments, the metal layer 180 is formed on the silicon substrate 170. However, a conductive thin layer other than the metal layer, such as polysilicon, may be used instead of the metal layer 180.

In the above embodiments, the metal layer 180 is formed on the silicon substrate 170 and the epitaxial film 130a is adhered onto the metal layer 180. However, the epitaxial film 130a may be adhered onto the silicon substrate 170 directly. In this case, the upper surface of the silicon substrate 170 and the lower surface of the epitaxial film 130 are provided with an appropriate chemical surface treatment to make a mirror finished surface so that both the surfaces contact closely and are bonded firmly by pressure and heat treatment. The temperature of the heat treatment required for the firm bonding is higher that that of the heat treatment through the metal layer. However, the bonding defect caused by the defect of the metal layer provided between the LED epi-film and the surface of the silicon substrate is prevented. Also, when the metal layer 180 is provided, since the LED epi-film is, for the alignment of the bonding position, aligned with respect to the pattern of the metal layer 180 which is aligned with respect to the driving ICs, it is more likely that the misalignment of the LED epi-film with respect to the driving ICs is increased. Accordingly, when the metal layer is not provided, the alignment margin with respect to the driving ICs can be set small. Moreover, it is possible to adhere the epitaxial film onto an insulating film, such as silicon oxide, formed on the silicon substrate.

In the above embodiments, a conductive thin layer including the metal layer 180 is rectangular-shaped. However, it may have the shape having a cut-off portion in a corner thereof and/or an uneven portion in sides thereof. In this case, the cut-off portion can be used as a reference section for the orientation of the chip and the uneven portion can be used as a reference section for the alignment.

In the above embodiment, the epitaxial film 130a is adhered onto the silicon substrate 170. As the material of the substrate, a compound semiconductor, an organic semiconductor, and an insulating material, such as glass and sapphire, may be used besides amorphous silicon, monocrystal silicon, polysilicon. The same variation can be applied to the substrate 270.

The semiconductor element formed in the semiconductor thin film or the epitaxial film 130a may be, instead of an LED, other light emitting elements, such as a laser, a photo detector, a hall element, and piezoelectric element. Other semiconductor thin films may be used instead of the epitaxial layer.

Also, the epitaxial film 130a may have a structure comprising a p-type $Al_xGa_{1-x}As$ layer, a p-type $Al_yGa_{1-y}As$ layer, an n-type $Al_zGa_{1-z}As$ layer, and a n-type GaAs layer formed in this order. Also, the dielectric film 140 may be formed to have a multi-layer structure instead of a single-layer structure.

As fully described above, according to the invention, a semiconductor thin films is adhered onto the surface of a substrate including a terminal region and electrically connected to the terminal region through a discrete wiring thin layer. Accordingly, it is possible to make a semiconductor device small and reduce the material cost.

In addition, according to the manufacturing method of the invention, the step of forming a protection layer or passivation film to cover a predetermined region of an epitaxial film is performed prior to the step of etching. Accordingly, the damage on a semiconductor device or a dielectric layer is decreased, which results in the increase of the manufacturing yield of the device.

What is claimed is:

1. A method of manufacturing a semiconductor device comprising a first substrate and a semiconductor thin film adhered onto a surface of said first substrate, said method comprising the steps of:

forming a separation layer on a second substrate;

forming said semiconductor thin film including all or part of semiconductor elements on said separation layer;

forming a protection layer on said semiconductor thin film such that said protection layer covers part of said semiconductor thin film;

forming a plurality of etching grooves by etching a region of said semiconductor thin film, which is not covered by said protection layer, so that said etching grooves divide said semiconductor thin film into a plurality of discrete semiconductor thin films, said etching groove reaching said separation layer;

etching said separation layer to make said discrete semiconductor thin films separatable from said second substrate;

adhering said discrete semiconductor thin films onto said surface of said first substrate; and removing said protection layer, wherein said protection layer is made of a material which has etching resistance against etchants used in said steps of forming said etching grooves and etching said separation layer.

2. The method of manufacturing a semiconductor device according to claim 1, which further comprises the step of forming a dielectric film on a predetermined region of said semiconductor thin film, wherein said protection layer is formed on said dielectric film.

3. The method of manufacturing a semiconductor device according to claim 1, which further comprises the step of forming a passivation film between said semiconductor thin film and said protection layer, wherein both of said protection layer and passivation film are made of a material which has etching resistance against said etchants used in said steps of forming said etching grooves and etching said separation layer.

4. The method of manufacturing a semiconductor device according to claim 2, which further comprises the step of forming a passivation film between said dielectric film and said protection layer, wherein both of said protection layer and passivation film are made of a material which has etching resistance against said etchants used in said steps of forming said etching grooves and etching said separation layer.

5. The method of manufacturing a semiconductor device according to claim 1, wherein said first substrate contains any one of material selected from amorphous silicon, monocrystal silicon, polycrystal silicon, compound semiconductor, organic semiconductor, and an insulating material.

6. The method of manufacturing a semiconductor device according to claim 1, wherein said first substrate is a silicon substrate comprising semiconductor circuits.

7. The method of manufacturing a semiconductor device according to claim 1, wherein said second substrate includes, as an uppermost layer, an etching-stopping layer made of a material which has etching resistance against said etchant used in said step of etching said separation layer.

8. The method of manufacturing a semiconductor device according to claim 1, wherein said semiconductor thin film is composed of a compound semiconductor epitaxial layer.

9. The method of manufacturing a semiconductor device according to claim 1, wherein said semiconductor elements are any of light emitting elements, photo detectors, Hall elements, and piezoelectric elements.

10. The method of manufacturing a semiconductor device according to claim 2, wherein said dielectric film is made of any of silicon oxide, silicon nitride, aluminum oxide, and aluminum nitride.

11. The method of manufacturing a semiconductor device according to claim 3, wherein said passivation film is made of either polyimide or aluminum nitride.

12. The method of manufacturing a semiconductor device according to claim 1, wherein said protection layer is made of an organic material.

13. The method of manufacturing a semiconductor device according to claim 1, which further comprises the step of forming a conductive layer in a region of said first substrate so that said discrete semiconductor thin films are adhered onto said conductive layer.

14. The method of manufacturing a semiconductor device according to claim 1, wherein said etchant used in the step of forming said etching grooves is made of hydrofluoric acid and said etchant used in the step of etching said separation layer is made of phosphoric acid or solution containing citric acid and hydrogen peroxide.

15. The method of manufacturing a semiconductor device according to claim 2, which further comprises the step of forming a plurality of discrete wiring layers by photolithography, wherein said discrete wiring layers are electrically connected to said semiconductor elements of said discrete semiconductor thin films which have been adhered onto said surface of said first substrate and extend above said dielectric layer.

16. The method of manufacturing a semiconductor device according to claim 4, which further comprises the step of forming a plurality of discrete wiring layers by photolithography, wherein said discrete wiring layers are electrically connected to said semiconductor elements of said discrete semiconductor thin films which have been adhered onto said surface of said first substrate and extend above said passivation film.

17. The method of manufacturing a semiconductor device according to claim 15, wherein said discrete wiring layers are made of any one of or any combination of two or more of layers selected from an Au layer, an Ti/Pt/Au laminated layer, an Au/Zn laminated layer, an Au/Ge laminated layer, a Ni/Au laminated layer, an AuGeNi/Au laminated layer, a Pd layer, a Pd/Au laminated layer, a MgAu laminated layer, an Al layer, an Al/Ni laminated layer, a polysilicon layer, an ITO layer, and a ZnO layer.

18. The method of manufacturing a semiconductor device according to claim 16, wherein said discrete wiring layers are made of any one of or any combination of two or more of layers selected from an Au layer, an Ti/Pt/Au laminated layer, an Au/Zn laminated layer, an Au/Ge laminated layer, a Ni/Au laminated layer, an AuGeNi/Au laminated layer, a Pd layer, a Pd/Au laminated layer, a MgAu laminated layer, an Al layer, an Al/Ni laminated layer, a polysilicon layer, an ITO layer, and a ZnO layer.

19. The method of manufacturing a semiconductor device according to claim 1, wherein said step of forming said etching grooves in said semiconductor thin film uses said protection layer as an etching mask such that a side of said protection layer and a side of said semiconductor thin film after forming said etching grooves are located at substantially same position.

* * * * *